United States Patent
Son et al.

(10) Patent No.: US 10,332,902 B2
(45) Date of Patent: *Jun. 25, 2019

(54) THREE-DIMENSIONAL SEMICONDUCTOR MEMORY DEVICE INCLUDING VERTICALLY STACKED ELECTRODES

(71) Applicant: SAMSUNG ELECTRONICS CO., LTD., Suwon-si, Gyeonggi-do (KR)

(72) Inventors: Yunghwan Son, Hwaseong-si (KR); Jaesung Sim, Hwaseong-si (KR); Shinhwan Kang, Seoul (KR); Youngwoo Park, Seoul (KR); Jaeduk Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 19 days.

This patent is subject to a terminal disclaimer.

(21) Appl. No.: 15/805,513

(22) Filed: Nov. 7, 2017

(65) Prior Publication Data
US 2018/0076212 A1  Mar. 15, 2018

Related U.S. Application Data

(63) Continuation of application No. 15/348,009, filed on Nov. 10, 2016, now Pat. No. 9,837,429, which is a
(Continued)

(30) Foreign Application Priority Data

Oct. 27, 2014  (KR) .......................... 10-2014-0146296

(51) Int. Cl.
*H01L 27/11575*  (2017.01)
*H01L 27/11582*  (2017.01)
(Continued)

(52) U.S. Cl.
CPC ........ *H01L 27/11575* (2013.01); *G11C 5/025* (2013.01); *G11C 16/0483* (2013.01);
(Continued)

(58) Field of Classification Search
CPC ............... H01L 27/11575; H01L 29/34; H01L 27/11582; H01L 27/11573;
(Continued)

(56) References Cited

U.S. PATENT DOCUMENTS 7,910,432 B2   3/2011  Tanaka et al.
8,324,680 B2  12/2012  Izumi et al.
(Continued)

OTHER PUBLICATIONS

U.S. Office Action dated May 5, 2017 related to U.S. Appl. No. 15/348,009.

*Primary Examiner* — David Lam
(74) *Attorney, Agent, or Firm* — F. Chau & Associates, LLC

(57) ABSTRACT

A three-dimensional (3D) semiconductor memory device that includes a peripheral logic structure including peripheral logic circuits disposed on a semiconductor substrate and a first insulation layer overlapping the peripheral logic circuits, and a plurality of memory blocks spaced apart from each other on the peripheral logic structure. At least one of the memory blocks includes a well plate electrode, a semiconductor layer in contact with a first surface of the well plate electrode, a stack structure including a plurality of electrodes vertically stacked on the semiconductor layer, and a plurality of vertical structures penetrating the stack structure and connected to the semiconductor layer.

20 Claims, 29 Drawing Sheets

Related U.S. Application Data continuation of application No. 14/878,453, filed on Oct. 8, 2015, now Pat. No. 9,515,087.

(51) Int. Cl.

| | |
|---|---|
| *H01L 27/11573* | (2017.01) |
| *H01L 29/34* | (2006.01) |
| *H01L 27/11526* | (2017.01) |
| *G11C 5/02* | (2006.01) |
| *G11C 16/04* | (2006.01) |
| *H01L 27/11517* | (2017.01) |
| *H01L 27/11565* | (2017.01) |
| *H01L 27/1157* | (2017.01) |
| *H01L 27/11548* | (2017.01) |
| *H01L 27/11556* | (2017.01) |
| *G11C 16/30* | (2006.01) |
| *H01L 27/11551* | (2017.01) |

(52) U.S. Cl.
CPC .... *H01L 27/1157* (2013.01); *H01L 27/11517* (2013.01); *H01L 27/11526* (2013.01); *H01L 27/11548* (2013.01); *H01L 27/11556* (2013.01); *H01L 27/11565* (2013.01); *H01L 27/11573* (2013.01); *H01L 27/11582* (2013.01); *H01L 29/34* (2013.01); *G11C 16/30* (2013.01); *H01L 27/11551* (2013.01)

(58) Field of Classification Search
CPC ......... H01L 27/11565; H01L 27/11556; H01L 27/11548; H01L 27/11526; H01L 27/11517; H01L 27/1157; H01L 27/01; G11C 16/30; G11C 16/0483; G11C 5/025
USPC .................................. 365/51, 63, 72, 185.17
See application file for complete search history.

(56) References Cited

U.S. PATENT DOCUMENTS

| | | | |
|---|---|---|---|
| 8,338,882 B2 | 12/2012 | Tanaka et al. | |
| 8,385,131 B2 | 2/2013 | Seol | |
| 8,642,416 B2 * | 2/2014 | Or-Bach | H01L 21/8221 |
| | | | 438/199 |
| 8,753,973 B2 | 6/2014 | Furuhashi | |
| 9,515,087 B2 * | 12/2016 | Son | G11C 5/025 |
| 9,837,429 B2 * | 12/2017 | Son | G11C 5/025 |
| 2010/0320526 A1 | 12/2010 | Kidoh et al. | |
| 2013/0049095 A1 * | 2/2013 | Whang | H01L 29/7889 |
| | | | 257/321 |
| 2013/0130468 A1 | 5/2013 | Higashitani et al. | |
| 2013/0147045 A1 * | 6/2013 | Grossi | H01L 27/0688 |
| | | | 257/741 |
| 2014/0015128 A1 | 1/2014 | Chae et al. | |
| 2014/0043916 A1 | 2/2014 | Costa et al. | |
| 2014/0065789 A1 | 3/2014 | Sasago et al. | |
| 2014/0097519 A1 | 4/2014 | Cho et al. | |
| 2017/0062453 A1 | 3/2017 | Son et al. | |

\* cited by examiner

THREE-DIMENSIONAL SEMICONDUCTOR MEMORY DEVICE INCLUDING VERTICALLY STACKED ELECTRODES

CROSS-REFERENCE TO RELATED APPLICATIONS

This application is a continuation of U.S. application Ser. No. 15/348,009 filed Nov. 10, 2016, now U.S. Pat. No. 9,837.429, which is a continuation of U.S. application Ser. No. 14/878,453 filed on Oct. 8, 2015, issued as U.S. Pat. No. 9,515,087 on Dec. 6, 2016, which claims priority under 35 U.S.C. § 119 to Korean Patent Application No. 10-2014-0146296, filed on Oct. 27, 2014, in the Korean Intellectual. Property Office, the disclosures of which are incorporated by reference herein in their entireties.

TECHNICAL FIELD

Exemplary embodiments of the inventive concept relate to three-dimensional (3D) semiconductor memory devices.

DISCUSSION OF THE RELATED ART

Semiconductor devices are becoming more highly integrated to meet demands of high performance and low costs. The integration density of a semiconductor device directly affects its cost. For example, an integration degree of a two-dimensional (2D) or planar semiconductor device is mainly determined by an area needed for a unit memory cell. Therefore, the integration density of the 2D or planar semiconductor device depends on a technique used for fine pattern formation. Even finer patterns may be formed to increase the density of the 2D or planar semiconductor device. However, extremely advanced and high-priced equipment is needed to form the fine patterns. Accordingly, three-dimensional (3D) semiconductor memory devices including three-dimensionally arranged memory cells have been developed to increase integration density.

SUMMARY

Exemplary embodiments of the inventive concepts provide three-dimensional (3D) semiconductor memory devices with increased reliability and integration density.

In an exemplary embodiment of the inventive concept, a 3D semiconductor memory device may include: a peripheral logic structure including peripheral logic circuits disposed on a semiconductor substrate and a first insulation layer overlapping the peripheral logic circuits; and a plurality of memory blocks disposed on the peripheral logic structure and spaced apart from each other. At least one of the memory blocks may include: a well plate electrode; a semiconductor layer in contact with a first surface of the well plate electrode; a stack structure including a plurality of electrodes vertically stacked on the semiconductor layer; and a plurality of vertical structures penetrating the stack structure and connected to the semiconductor layer.

In an exemplary embodiment of the inventive concept, the stack structure may extend in a first direction on the semiconductor layer. The semiconductor layer may include a common source region disposed at a side of the stack structure. The common source region may have dopants of a first conductivity type.

In an exemplary embodiment of the inventive concept, the common source region may be spaced apart from the well plate electrode.

In an exemplary embodiment of the inventive concept, the peripheral logic circuits may include a voltage generator disposed on the semiconductor substrate, and the peripheral logic structure may further include: a first interconnection structure for electrically connecting the well plate electrode to the voltage generator.

In an exemplary embodiment of the inventive concept, the peripheral logic circuits may include a page buffer and a voltage generator that are disposed on the semiconductor substrate. The peripheral logic structure may further include: a plurality of first interconnections electrically connected to the page buffer; and a second interconnection electrically connected to the voltage generator. The second interconnection may be electrically connected to the well plate electrode.

In an exemplary embodiment of the inventive concept, the second interconnection may include a plurality of second interconnections. The second interconnections and the first interconnections may be disposed at the same level from a first surface of the semiconductor substrate, and the plurality of first interconnections may be arranged between the second interconnections spaced apart from each other.

In an exemplary embodiment of the inventive concept, the at least one memory block may further include: a plurality of third interconnections extending in parallel to each other on the stack structure. The third interconnections may be electrically connected to the first interconnections.

In an exemplary embodiment of the inventive concept, the semiconductor layer may have dopants of a second conductivity type. The semiconductor layer may include: a first portion in contact with the well plate electrode; and a second portion on the first portion. A concentration of the dopants of the second conductivity type in the first portion may be higher than a concentration of the dopants of the second conductivity type in the second portion.

In an exemplary embodiment of the inventive concept, the semiconductor layer may include a well dopant region that has a second conductivity type and is in contact with the well plate electrode.

In an exemplary embodiment of the inventive concept, the well plate electrode of the at least one memory block and a well plate electrode of another memory block may be spaced apart from each other on the first insulation layer.

In an exemplary embodiment of the inventive concept, an area of the well plate electrode may be substantially equal to an area of the semiconductor layer.

In an exemplary embodiment of the inventive concept, the 3D semiconductor memory device may further include: a data storage layer disposed between the stack structure and each of the vertical structures.

In an exemplary embodiment of the inventive concept, a 3D semiconductor memory device may include: a well plate electrode; a semiconductor layer overlapping a first surface of the well plate electrode; a plurality of stack structures extending in parallel to each other along a first direction on the semiconductor layer, first and second stack structures of the stack structures comprising a plurality of electrodes vertically stacked on the semiconductor layer; vertical structures penetrating the first and second stack structures and connected to the semiconductor layer; and common source regions formed in the semiconductor layer between the first and second stack structures, the common source regions having dopants of a first conductivity type.

In an exemplary embodiment of the inventive concept, the common source regions may be spaced apart from the first surface of the well plate electrode.

In an exemplary embodiment of the inventive concept, the semiconductor layer may include a well dopant region that has a second conductivity type and is in contact with the well plate electrode.

In an exemplary embodiment of the inventive concept, the semiconductor layer may have dopants of a second conductivity type. The semiconductor layer may include: a first portion in contact with the well plate electrode; and a second portion on the first portion. A concentration of the dopants of the second conductivity type in the first portion may be higher than a concentration of the dopants of the second conductivity type in the second portion.

In an exemplary embodiment of the inventive concept, an area of the well plate electrode may be substantially equal to an area of the semiconductor layer.

In an exemplary embodiment of the inventive concept, the 3D semiconductor memory device may further include: a peripheral logic structure including peripheral logic circuits formed on a semiconductor substrate and a first insulation layer overlapping the peripheral logic circuits. The well plate electrode may be disposed on the first insulation layer.

In an exemplary embodiment of the inventive concept, the peripheral logic circuits may include a voltage generator disposed on the semiconductor substrate and electrically connected to the well plate electrode. A vertical distance between the voltage generator and the well plate electrode may be smaller than vertical heights of the first and second stack structures.

In an exemplary embodiment of the inventive concept, the 3D semiconductor memory device may further include: a data storage layer disposed between the first and second stack structures and each of the vertical structures.

In an exemplary embodiment of the inventive concept, a 3D semiconductor memory device may include: a first logic circuit disposed on a semiconductor substrate; an insulating layer disposed on the at least one logic circuit and the semiconductor substrate; a well plate electrode disposed on the insulating layer and overlapping the first logic circuit; and a semiconductor layer disposed between the well plate electrode and a plurality of vertically stacked electrodes.

In an exemplary embodiment of the inventive concept, the well plate electrode may be in direct contact with a first surface of the semiconductor layer.

In an exemplary embodiment of the inventive concept, an entire first surface of the semiconductor layer may be in direct contact with the well plate electrode.

In an exemplary embodiment of the inventive concept, the first logic circuit may be a voltage generator or a page buffer.

In an exemplary embodiment of the inventive concept, the well plate electrode, the semiconductor layer and the vertically stacked electrodes may form a cell array structure.

BRIEF DESCRIPTION OF THE DRAWINGS

The above and other features of the inventive concept will become more apparent by describing in detail exemplary embodiments thereof with reference to the attached drawings, in which.

DETAILED DESCRIPTION OF THE EMBODIMENTS

Figure 1:
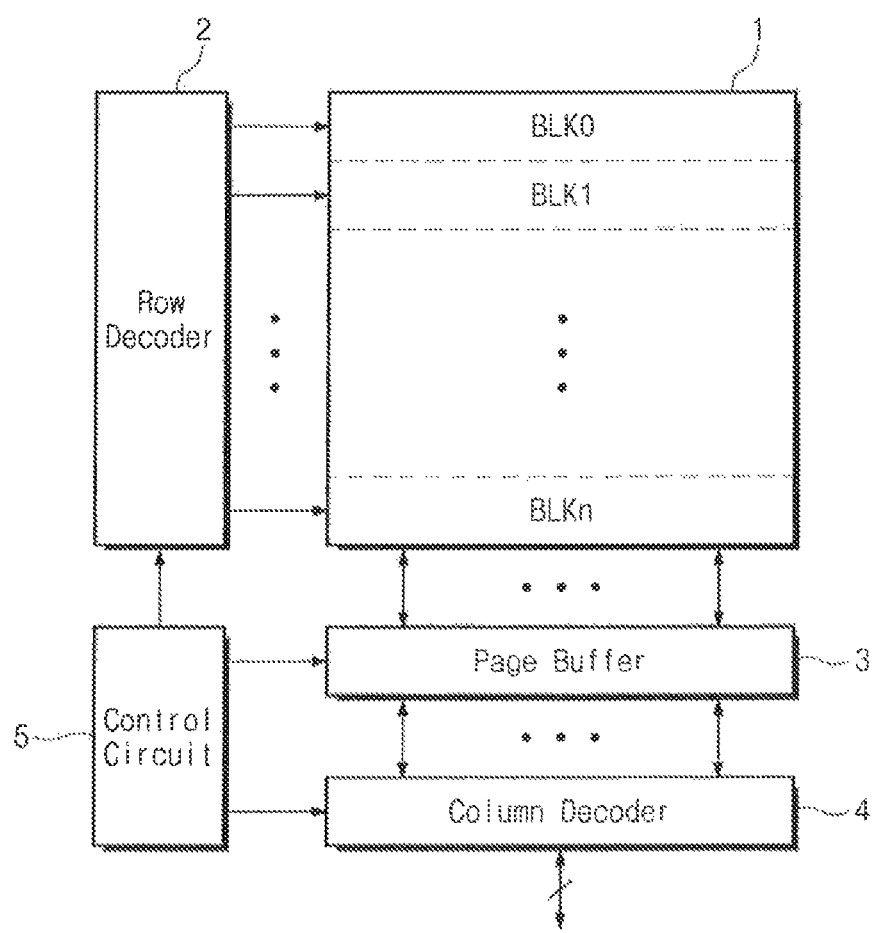
FIG. 1 is a block diagram illustrating a three-dimensional (3D) semiconductor memory device according to an exemplary embodiment of the inventive concept.

Exemplary embodiments of the inventive concept will now be described more fully hereinafter with reference to the accompanying drawings. The inventive concept, however, may be embodied in various forms and should not be construed as being limited to only the illustrated embodiments. In the drawings, the sizes and relative sizes of layers and regions may be exaggerated for clarity.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present.

It will be understood that when an element such as a layer, region or substrate is referred to as being "on" another element, it can be directly on the other element or intervening elements may be present.

The same reference numerals or the same reference designators may denote the same elements throughout the specification.

Moreover, exemplary embodiments of the inventive concept are described herein with reference to cross-sectional illustrations and/or plane illustrations that are idealized examples. Accordingly, variations from the shapes of the illustrations as a result, for example, of manufacturing techniques and/or tolerances, are to be expected. Thus, exemplary embodiments of the inventive concept should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the inventive concept.

Further, devices and methods of forming devices according to exemplary embodiments of the inventive concept described herein may be embodied in microelectronic devices such as integrated circuits. In this case, a plurality of devices according to exemplary embodiments of the inventive concept described herein may be integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to exemplary embodiments of the inventive concept described herein may include a plurality of the devices in an array and/or in a two-dimensional pattern depending on the functionality of the microelectronic device.

The devices according to exemplary embodiments of the inventive concept described herein may be interspersed among other devices depending on the functionality of the microelectronic device. Moreover, microelectronic devices according to exemplary embodiments of the inventive concept described herein may be replicated in a third direction that may be orthogonal to the two different directions, to provide three-dimensional integrated circuits.

Accordingly, the cross-sectional view(s) illustrated herein provide support for a plurality of devices according to exemplary embodiments of the inventive concept described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc.) thereon, as would be illustrated by a plan view of the device/structure.

FIG. 1 is a block diagram illustrating a three-dimensional (3D) semiconductor memory device according to an exemplary embodiment of the inventive concept.

Referring to FIG. 1, the 3D semiconductor memory device may include a memory cell array 1, a row decoder 2, a page buffer 3, a column decoder 4, and control circuits 5.

The memory cell array 1 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 2 may decode an address signal inputted from an external system to select one of the word lines. The address signal decoded by the row decoder 2 may be provided to a row driver. The row driver may provide word line voltages generated from a voltage generation circuit to the selected word line and unselected word lines in response to a control signal of the control circuits 5. The row decoder 2 may be connected in common to the plurality of memory blocks BLK0 to BLKn and may provide driving signals to the word lines of a memory block selected by a block selection signal.

The page buffer 3 may be connected to the memory cell array 1 through the bit lines to read data stored in the memory cells. The page buffer 3 may be connected to a selected bit line in response to an address signal decoded by the column decoder 4. According to an operation mode, the page buffer 3 may temporarily store data to be stored in the memory cells or may sense data stored in the memory cells. For example, the page buffer 3 may be operated as a write driver during a program operation mode and may be operated as a sense amplifier during a read operation mode. The page buffer 3 may receive a power (e.g., a voltage or a current) from the control circuits 5 and may provide the received power to the selected bit line.

The column decoder 4 may provide a data-transmitting path between the page buffer 3 and an external device (e.g., a memory controller). The column decoder 4 may decode an inputted address signal to select one of the bit lines. The column decoder 4 may be connected in common to the plurality of memory blocks BLK0 to BLKn and may provide data to the bit lines of the memory block selected by the block selection signal.

The control circuits 5 may control overall operations of the 3D semiconductor memory device. The control circuits 5 may receive control signals and an external voltage and may be operated in response to the received control signals. The control circuits 5 may include a voltage generator that generates voltages (e.g., a program voltage, a read voltage, and an erase voltage) used for internal operations by way of the external voltage. The control circuits 5 may control a read operation, a write operation, and/or an erase operation in response to the control signals.

Figure 2:
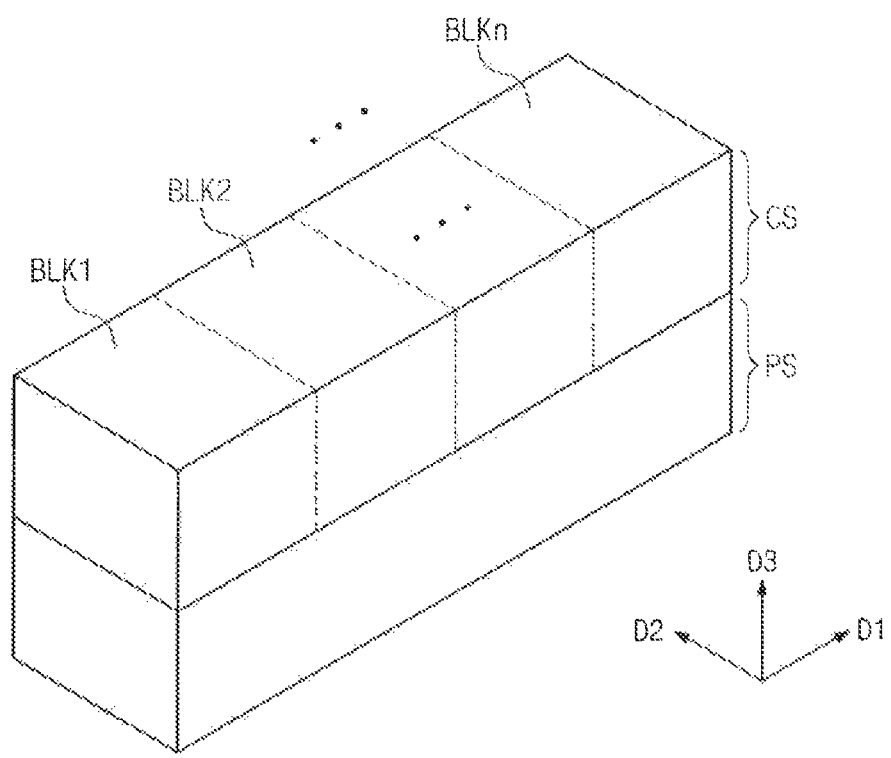
FIG. 2 is a perspective view illustrating a 3D semiconductor memory device according to an exemplary embodiment of the inventive concept.

FIG. 2 is a perspective view illustrating a 3D semiconductor memory device according to an exemplary embodiment of the inventive concept.

Referring to FIG. 2, the 3D semiconductor memory device may include a peripheral logic structure PS and a cell array structure CS. The cell array structure CS may be stacked on the peripheral logic structure PS. In other words, the cell array structure CS may overlap the peripheral logic structure PS when viewed from a plan view.

In an exemplary embodiment of the inventive concept, the peripheral logic structure PS may include the row and column decoders 2 and 4, the page buffer 3 and the control circuits 5 which are described with reference to FIG. 1. The cell array structure CS may include a plurality of memory blocks BLK0 to BLKn. Each of the memory blocks BLK0 to BLKn may correspond to a data-erasing unit. The memory blocks BLK0 to BLKn may include structures stacked on a plane extending in first and second directions D1 and D2. The structures may be stacked along a third direction D3 on the plane. Each of the memory blocks BLK0 to BLKn may include a cell array having a 3D structure (or a vertical structure). The cell array may include a plurality of three-dimensionally arranged memory cells, a plurality of word lines, and a plurality of bit lines. The word lines and the bit lines may be connected to the three-dimensionally arranged memory cells.

Figure 3:
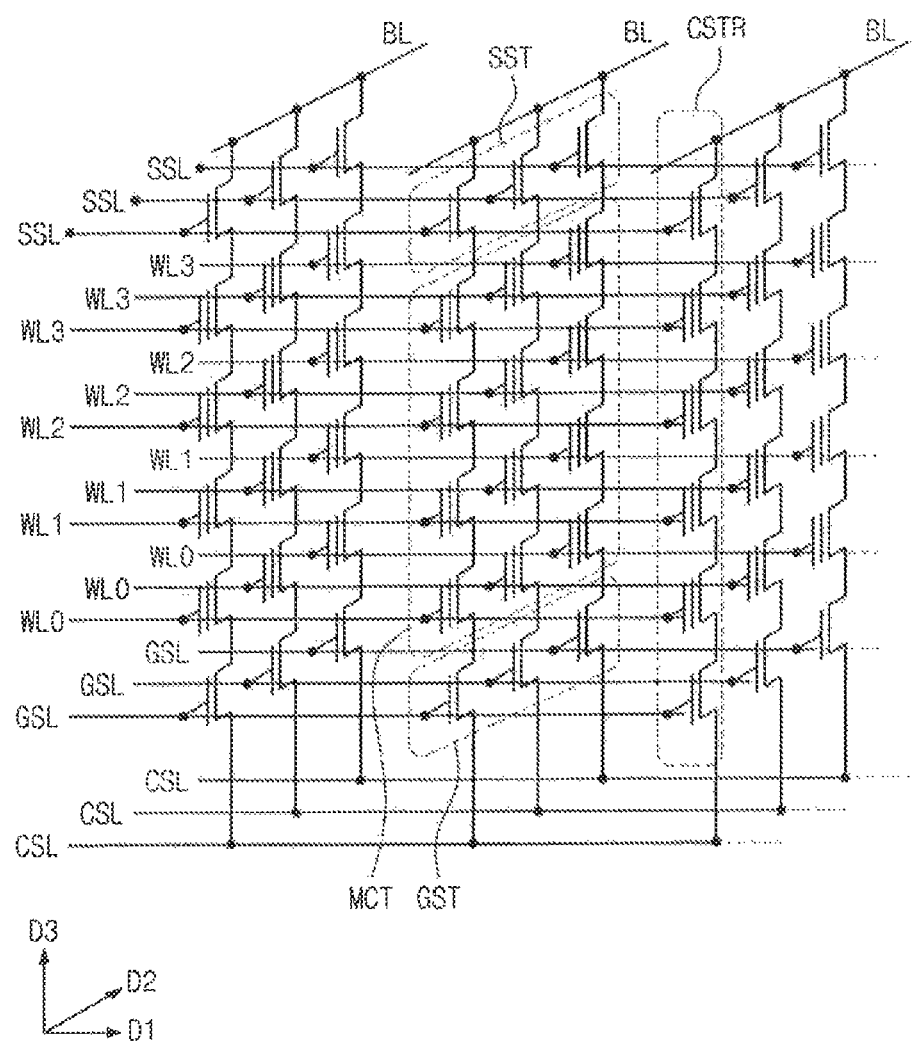
FIG. 3 is a circuit diagram illustrating a cell array of a 3D semiconductor memory device according to an exemplary embodiment of the inventive concept.

FIG. 3 is a circuit diagram illustrating a cell array of a 3D semiconductor memory device according to an exemplary embodiment of the inventive concept.

Referring to FIG. 3, the cell array may include a common source line CSL, a plurality of bit lines BL, and a plurality of cell strings CSTR disposed between the common source line CSL and the bit lines BL.

The bit lines BL may be two-dimensionally arranged. A plurality of the cell strings CSTR may be connected in parallel to each of the bit lines BL. The cell strings CSTR may be connected in common to the common source line CSL. In other words, a plurality of the cell strings CSTR may be disposed between a common source line CSL and the plurality of bit lines BL. In an exemplary embodiment of the inventive concept, the common source line CSL may be provided in plural, and the plurality of common source lines CSL may be two-dimensionally arranged. The same voltage may be applied to the plurality of the common source lines CSL. Additionally, the plurality of common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT and the string selection transistor SST may be connected in series to each other.

The common source line CSL may be connected in common to sources of the ground selection transistors GST. A ground selection line GSL, a plurality of word lines WL0 to WL3 and a string selection line SSL which are disposed between the common source line CSL and the bit lines BL may be used as gate electrodes of the ground selection transistor GST, the memory cell transistors MCT and the string selection transistor SST, respectively. The ground selection line GSL and the string selection line SSL may be provided in plural. Each of the memory cell transistors MCT may include a data storage element.

Figure 4:
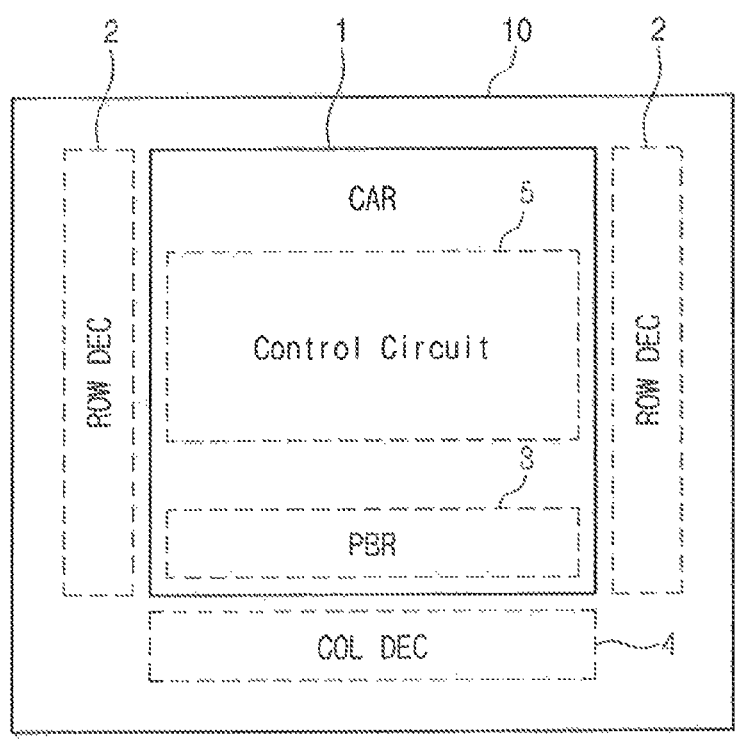
FIGS. 4 and 5 are plan views each illustrating a 3D semiconductor memory device according to an exemplary embodiment of the inventive concept.
Figure 5:
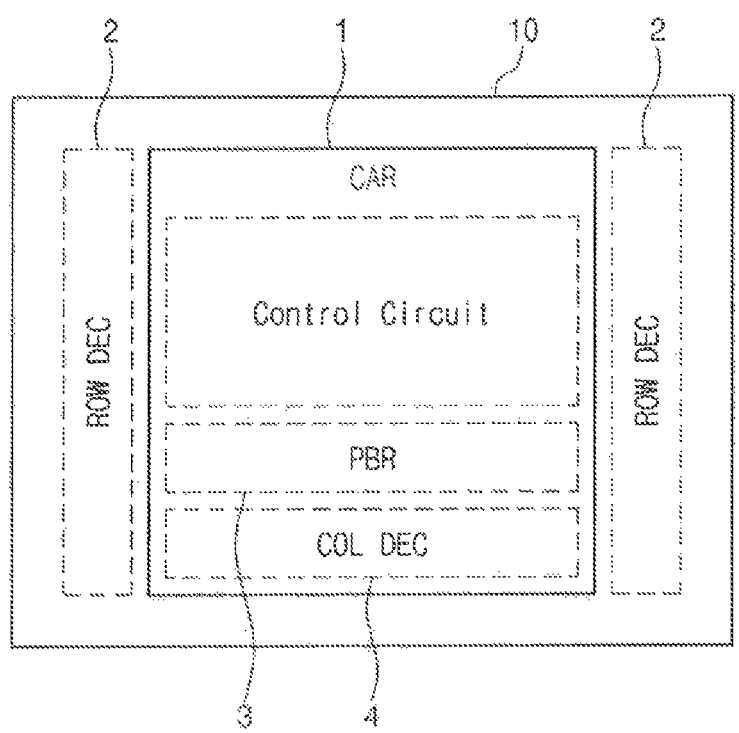

FIGS. 4 and 5 are plan views each illustrating a 3D semiconductor memory device according to an exemplary embodiment of the inventive concept.

Referring to FIGS. 4 and 5, row and column decoders 2 and 4, the page buffer 3, and control circuits 5 which constitute the peripheral logic structure (PS of FIG. 2) may be disposed on a semiconductor substrate 10. According to an exemplary embodiment of the inventive concept, the cell array structure (CS of FIG. 2) including a cell array 1 (CAR) may be disposed on the page buffer 3 and the control circuits 5. For example, as illustrated in FIG. 4, the page buffer 3 and the control circuits 5 may overlap the cell array 1, and the row and column decoders 2 and 4 may be disposed around the cell array 1 when viewed from a plan view. In an exemplary embodiment of the inventive concept, as illustrated in FIG. 5, the column decoder 4, the page buffer 3, and the control circuits 5 may overlap the cell array 1 when viewed from a plan view. In this case, the row decoders 2 may be disposed around the cell array 1 when viewed from a plan view.

Figure 6:
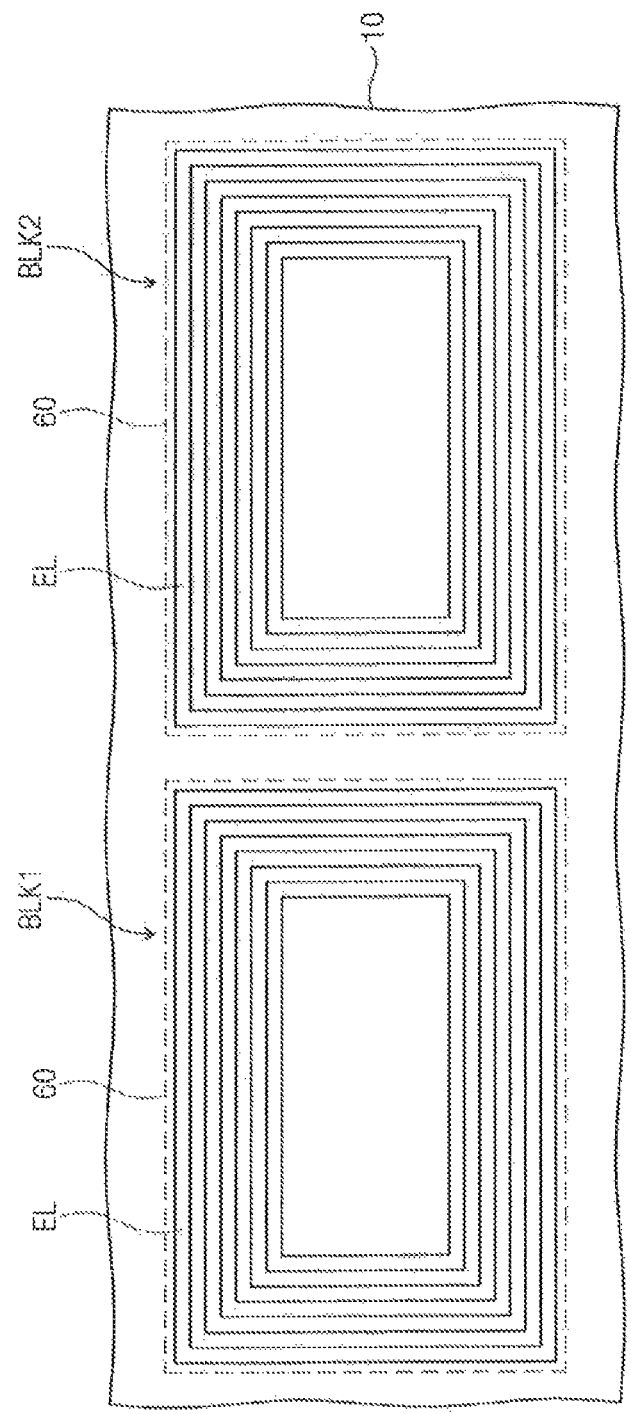
FIG. 6 is a plan view illustrating a 3D semiconductor memory device according to an exemplary embodiment of the inventive concept.
Figure 7:
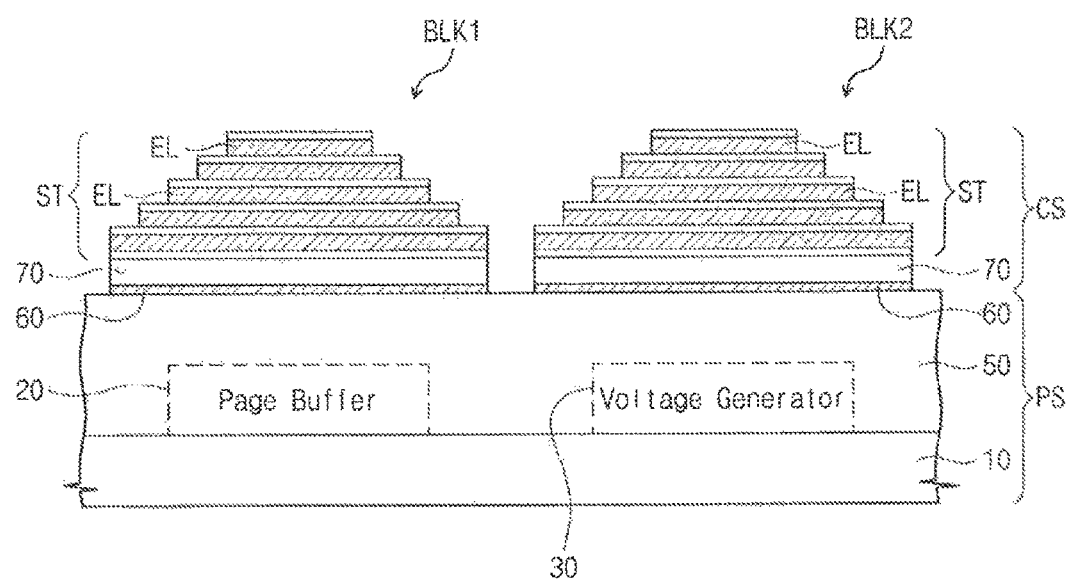
FIG. 7 is a cross-sectional view illustrating a 3D semiconductor memory device according to an exemplary embodiment of the inventive concept.
Figure 8:
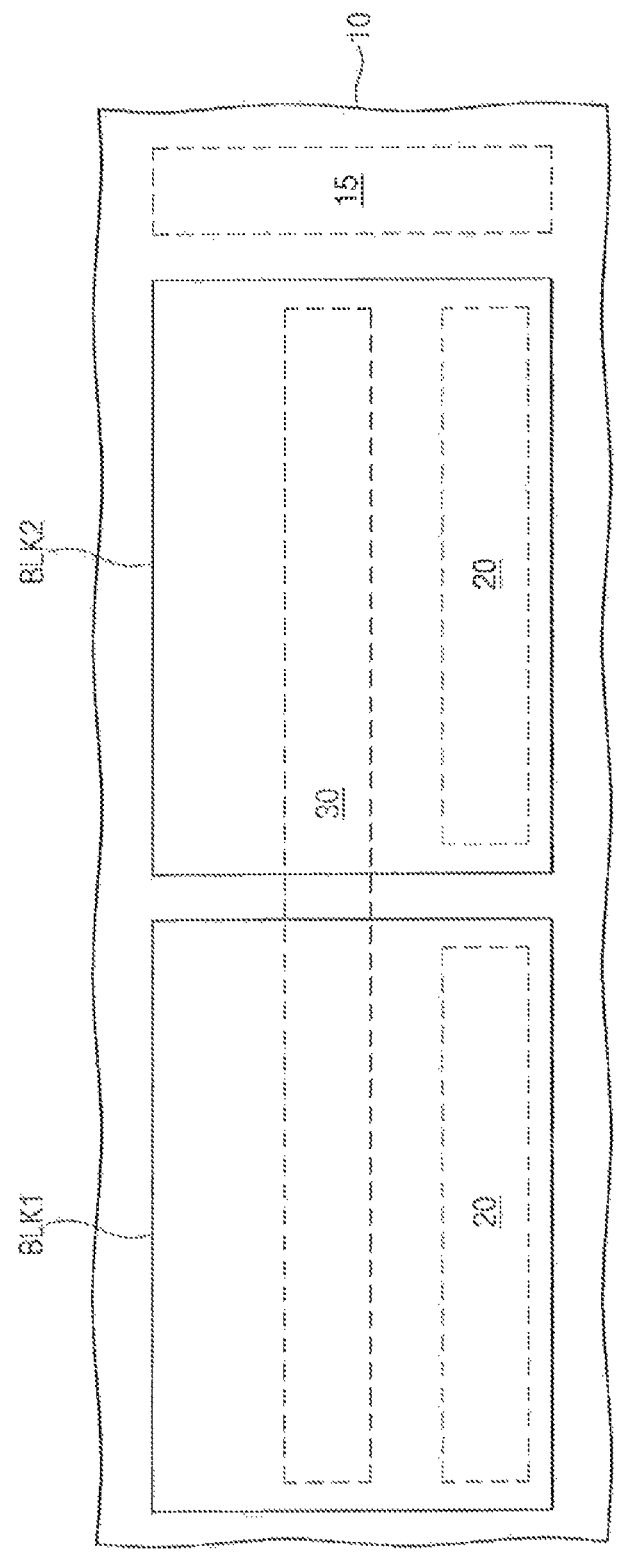
FIGS. 8 and 9 are diagrams each illustrating an arrangement of peripheral logic circuits in a 3D semiconductor memory device according to an exemplary embodiment of the inventive concept.
Figure 9:
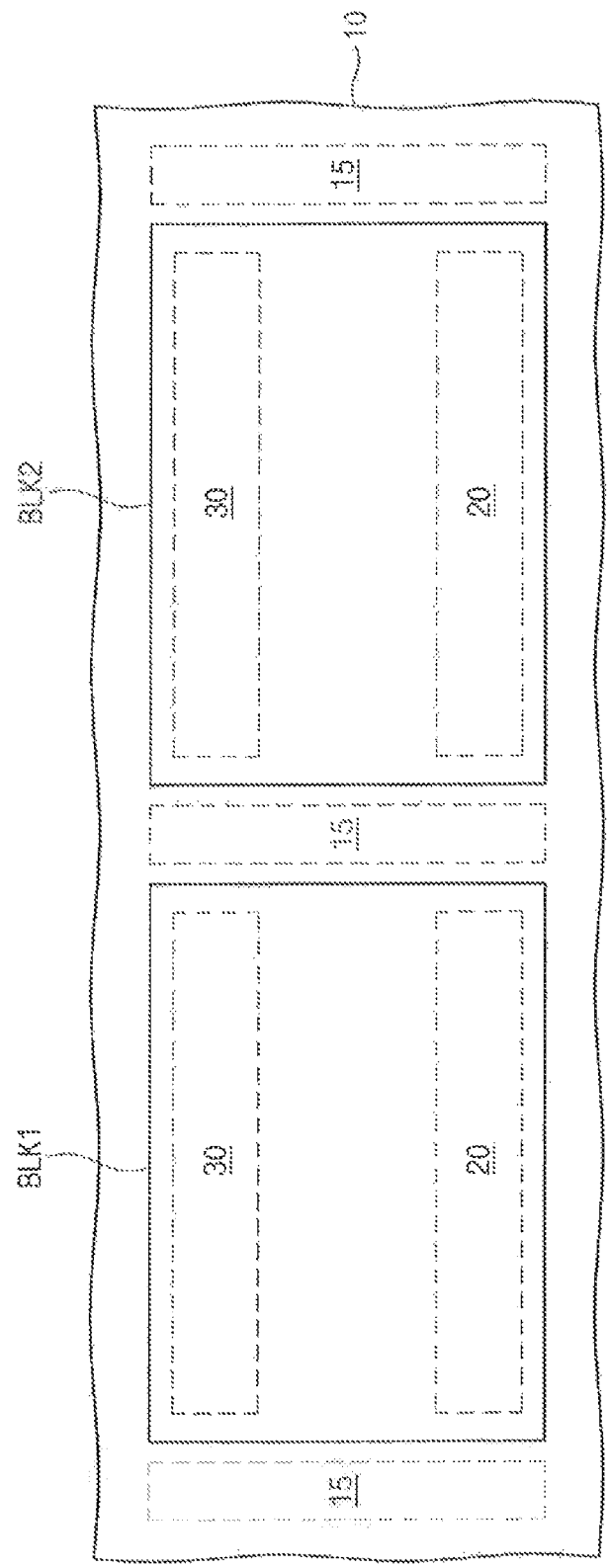

FIG. 6 is a plan view illustrating a 3D semiconductor memory device according to an exemplary embodiment of the inventive concept. FIG. 7 is a cross-sectional view illustrating a 3D semiconductor memory device according to an exemplary embodiment of the inventive concept. FIGS. 8 and 9 are diagrams each illustrating an arrangement of peripheral logic circuits in a 3D semiconductor memory device according to an exemplary embodiment of the inventive concept.

Referring to FIGS. 6 and 7, the peripheral logic structure PS and the cell array structure CS may be sequentially stacked on the semiconductor substrate 10. In other words, the peripheral logic structure PS may be disposed between the semiconductor substrate 10 and the cell array structure CS in a vertical view. The peripheral logic structure PS and the cell array structure CS may overlap each other in a plan view.

In an exemplary embodiment of the inventive concept, the semiconductor substrate 10 may be a silicon substrate, a silicon-germanium substrate, a germanium substrate, or a single-crystalline epitaxial layer grown on a single-crystalline silicon substrate.

According to an exemplary embodiment of the inventive concept, the peripheral logic structure PS may include peripheral logic circuits integrated on the semiconductor substrate 10 and a lower insulation layer 50 covering the peripheral logic circuits. For example, the peripheral logic circuits may include the row and column decoders 2 and 4, the page buffer 3 and the control circuits 5 described with reference to FIGS. 1 and 4. According to an exemplary embodiment of the inventive concept, a page buffer 20 and a voltage generator 30 may be disposed under the cell array structure CS and may be electrically connected to the cell array structure CS.

In an exemplary embodiment of the inventive concept, the cell array structure CS may be stacked on the peripheral logic structure PS and may include a plurality of memory blocks BLK1 and BLK2. Each of the memory blocks BLK1 and BLK2 may include a well plate electrode 60, a semiconductor layer 70, and a stack structure ST.

The well plate electrode 60 may be disposed on the peripheral logic structure PS and may have a plate shape. The well plate electrode 60 may be disposed on a top surface of the lower insulation layer 50. In an exemplary embodiment of the inventive concept, the well plate electrodes 60 of the memory blocks BLK1 and BLK2 may be spaced apart from each other. The well plate electrode 60 may be electrically connected to the voltage generator 30 of the peripheral logic structure PS. The well plate electrode 60 may include a metal (e.g., tungsten, copper, or aluminum), a conductive metal nitride (e.g., titanium nitride or tantalum nitride), a transition metal (e.g., titanium or tantalum), and/or a metal silicide layer. According to an exemplary embodiment of the inventive concept, an erase voltage generated by the voltage generator 30 may be applied to the well plate electrode 60 during an erase operation of the 3D semiconductor memory device.

The semiconductor layer 70 may be in direct contact with a top surface of the well plate electrode 60 and may cover an entire top surface of the well plate electrode 60. The semiconductor layer 70 may include silicon (Si), germanium (Ge), or a mixture thereof. The semiconductor layer 70 may be formed of a semiconductor material doped with dopants having a first conductivity type or an intrinsic semiconductor material not doped with dopants. In addition, the semiconductor layer 70 may have a single-crystalline structure, an amorphous structure, or a poly-crystalline structure.

The stack structure ST may include electrodes EL sequentially stacked on the semiconductor layer 70. The electrodes EL may form memory cells. Each of the electrodes EL may be formed of a conductive material (e.g., doped silicon or a metal) and may have a line shape or a plate shape.

According to an exemplary embodiment of the inventive concept, as illustrated in FIG. 8, the page buffer 20 may be disposed under each of the memory blocks BLK1 and BLK2 and the voltage generator 30 may be disposed under a plurality of the memory blocks BLK1 and BLK2. In addition, a row decoder 15 may be disposed at a side of the memory blocks BLK1 and BLK2 when viewed from a plan view. According to an exemplary embodiment of the inventive concept, as illustrated in FIG. 9, the page buffer 20 and the voltage generator 30 may be disposed under each of the memory blocks BLK1 and BLK2 when viewed from a plan view. In addition, the row decoders 15 may be disposed at sides of the memory blocks BLK1 and BLK2 and between the memory blocks BLK1 and BLK2. In an exemplary embodiment of the inventive concept, the voltage generator 30 may generate voltages (e.g., a program voltage, a read voltage, and an erase voltage) used for internal operations of the 3D semiconductor memory device. The voltage generator 30 may provide the generated erase voltage to the well plate electrode 60 of a selected one of the memory blocks BLK1 and BLK2.

Figure 10:
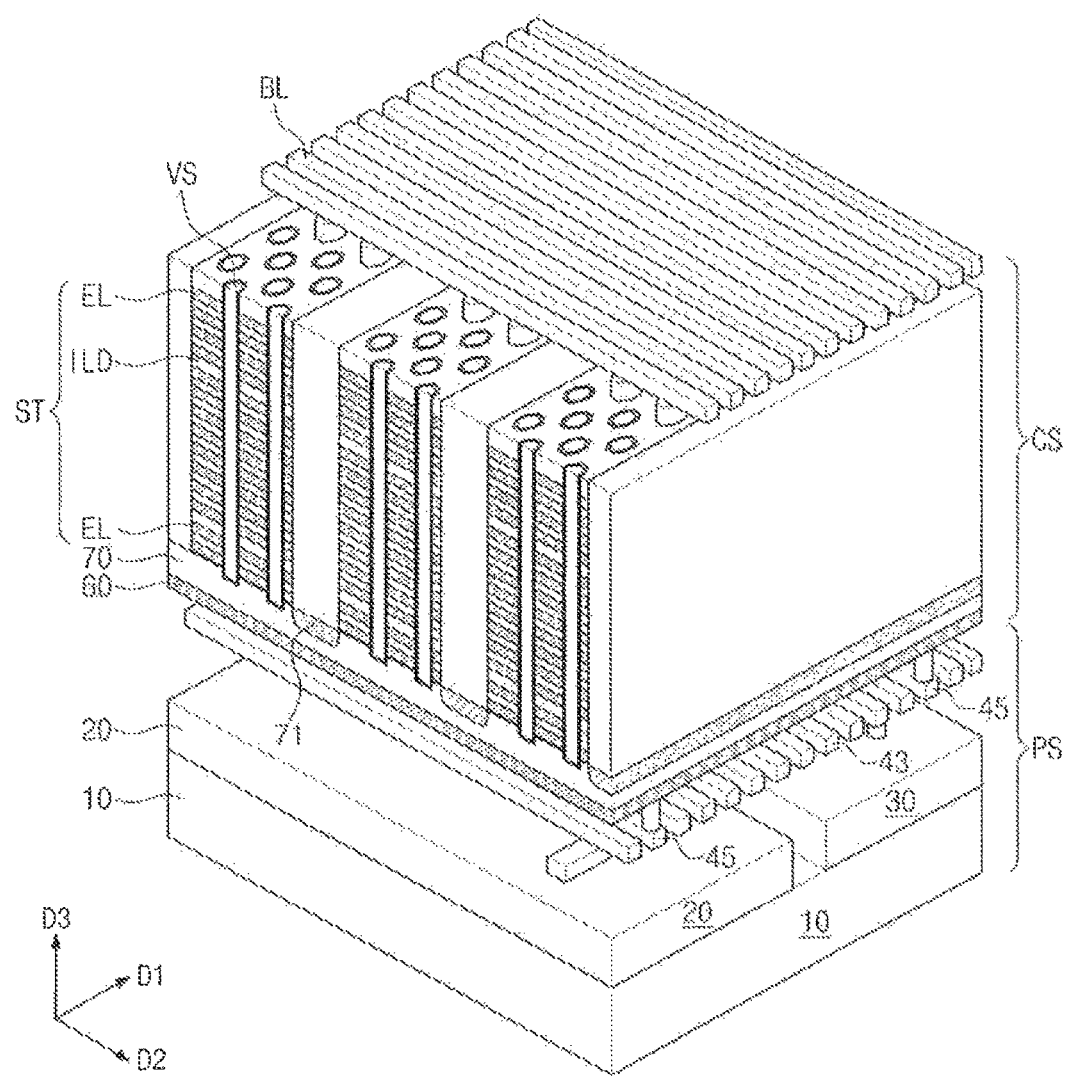
FIG. 10 is a perspective view illustrating a 3D semiconductor memory device according to an exemplary embodiment of the inventive concept.
Figure 11:
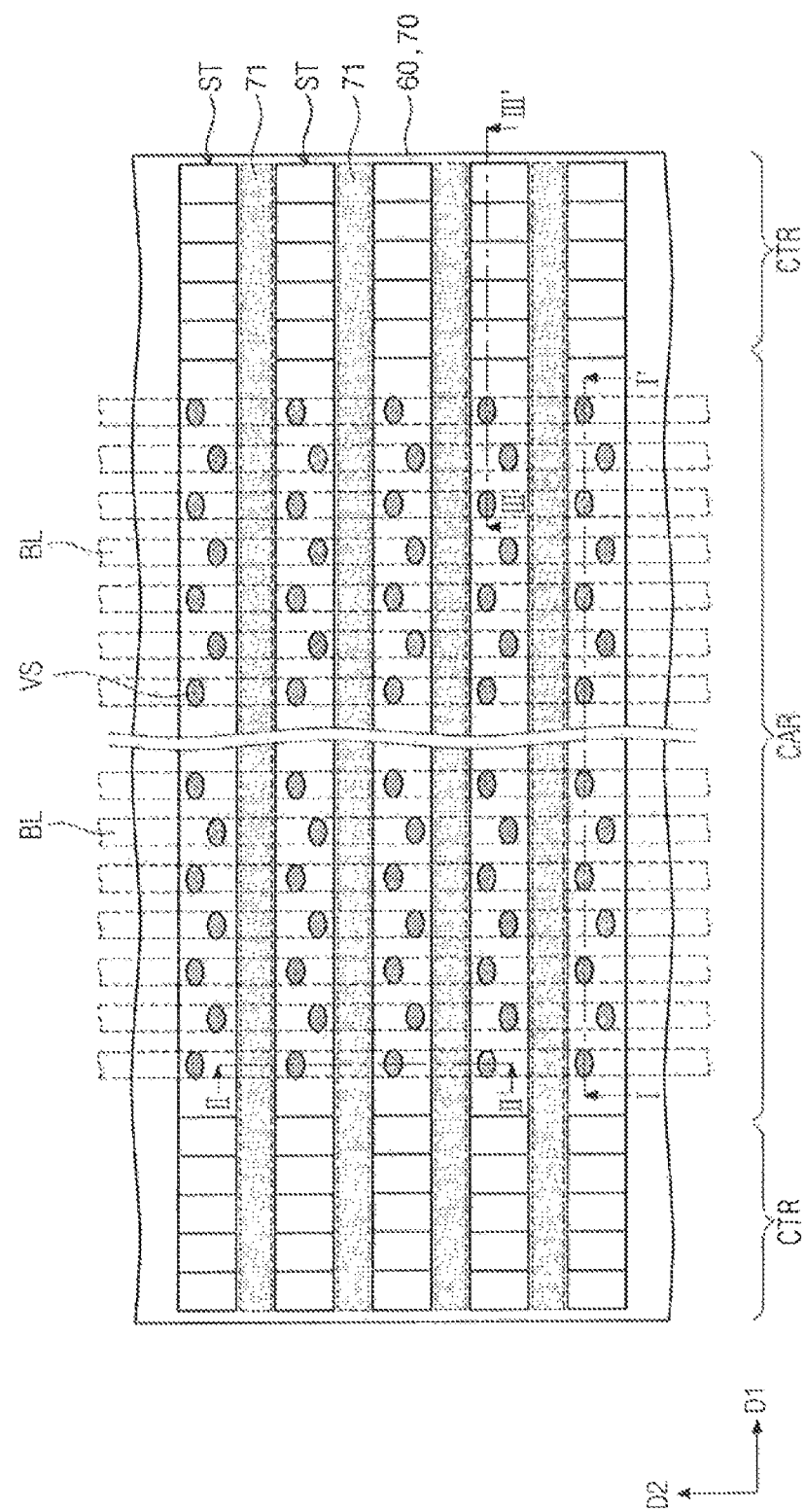
FIG. 11 is a plan view illustrating a portion of a 3D semiconductor memory device according to an exemplary embodiment of the inventive concept.
Figure 12:
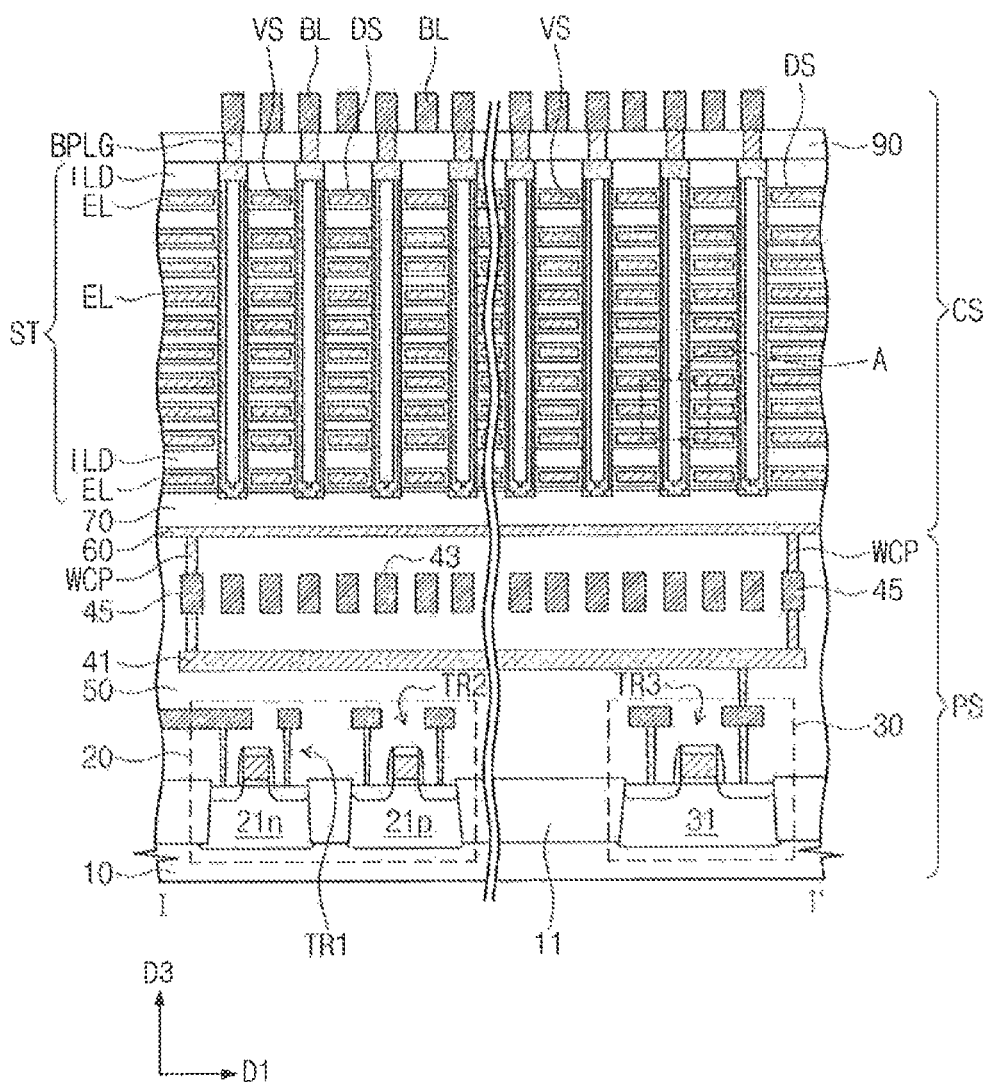
FIGS. 12, 13, and 14 are cross-sectional views respectively taken along lines I-I', II-II', and III-III' of FIG. 11 to illustrate a portion of a 3D semiconductor memory device according to an exemplary embodiment of the inventive concept.
Figure 13:
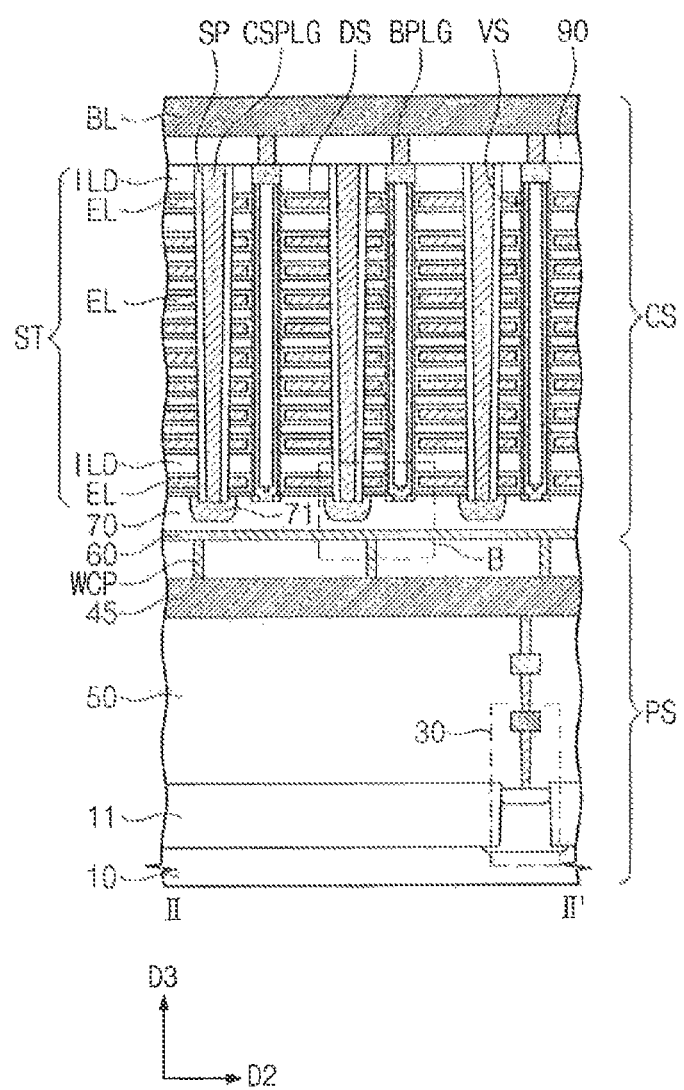
Figure 14:
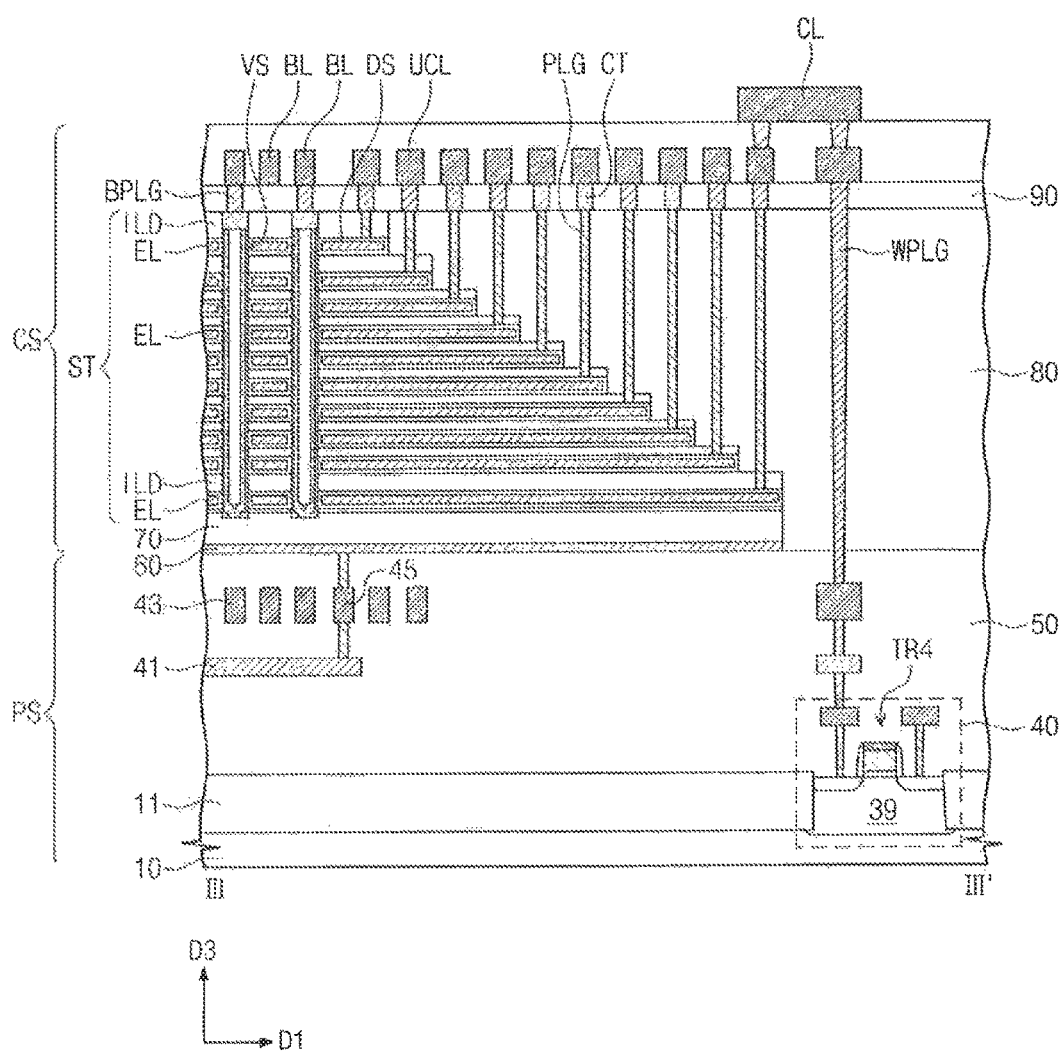

FIG. 10 is a perspective view illustrating a 3D semiconductor memory device according to an exemplary embodiment of the inventive concept. FIG. 11 is a plan view illustrating a portion of a 3D semiconductor memory device according to an exemplary embodiment of the inventive concept. FIGS. 12 to 14 are cross-sectional views respectively taken along lines I-I', II-II', and III-III' of FIG. 11 to illustrate a portion of a 3D semiconductor memory device according to an exemplary embodiment of the inventive concept.

Referring to FIGS. 10 to 14, a cell array structure CS may be stacked on a peripheral logic structure PS. In other words, the cell array structure CS may overlap the peripheral logic structure PS when viewed from a plan view.

According to an exemplary embodiment of the inventive concept, the peripheral logic structure PS may include peripheral logic circuits such as row and column decoders (2 and 4 of FIG. 1), a page buffer (3 of FIG. 1), and control circuits (5 of FIG. 1). The peripheral logic circuits may be integrated on an entire top surface of a semiconductor substrate 10. In addition, the peripheral logic structure PS may further include a lower interconnection structure electrically connected to the peripheral logic circuits and a lower insulation layer 50 covering the peripheral logic circuits and the lower interconnection structure.

According to an exemplary embodiment of the inventive concept, the peripheral logic structure PS may include first and second metal-oxide-semiconductor (MOS) transistors TR1 and TR2 included in a page buffer 20, a third MOS transistor TR3 included in a voltage generator 30, and a fourth MOS transistor TR4 included in a row decoder 40.

The first MOS transistor TR1 may be formed on a first well region 21*n* that is formed by doping a portion of the semiconductor substrate 10 with N-type dopants. The second MOS transistor TR2 may be formed on a second well region 21*p* that is formed by doping a portion of the semiconductor substrate 10 with P-type dopants. The third MOS transistor TR3 may be formed on a third well region 31 that is formed by doping a portion of the semiconductor substrate 10 with N-type or P-type dopants. The fourth MOS transistor TR4 may be formed on a fourth well region 39 that is formed by doping a portion of the semiconductor substrate 10 with N-type or P-type dopants. Active regions may be defined in the first to fourth well regions 21*n*, 21*p*, 31, and 39 by a device isolation layer 11, respectively. In addition, contact plugs and interconnections that are electrically connected to the lower interconnection structure may be connected to the first to fourth MOS transistors TR1, TR2, TR3, and TR4. For example, such connections may be made to source and/or drain electrodes of the first to fourth MOS transistors TR1, TR2, TR3, and TR4. In detail, as shown in FIG. 12, MOS transistor TR3 may be connected to a linking interconnection 41 via two contact plugs and an interconnection disposed between the two contact plugs.

According to an exemplary embodiment of the inventive concept, the lower interconnection structure may be disposed between the cell array structure CS and the peripheral logic circuits in a vertical view. The lower interconnection structure may include first lower interconnections 43, the linking interconnection 41, and second lower interconnections 45. The first lower interconnections 43 may be electrically connected to the page buffer 20. The linking interconnection 41 and the second lower interconnections 45 may be electrically connected to the voltage generator 30. In addition, one or more well contact plugs WCP may be connected to the second lower interconnections 45. Top surfaces of the well contact plugs WCP may be substantially coplanar with a top surface of the lower insulation layer 50.

According to an exemplary embodiment of the inventive concept, the cell array structure CS may include a well plate electrode 60, a semiconductor layer 70 covering the well plate electrode 60, stack structures ST disposed on the semiconductor layer 70, and vertical structures VS penetrating each of the stack structures ST. Each of the stack structures ST may include electrodes EL vertically stacked on the semiconductor layer 70.

The well plate electrode 60 may be disposed on the top surface of the lower insulation layer 50 and may be in contact with the top surfaces of the well contact plugs WCP. In an exemplary embodiment of the inventive concept, the well plate electrode 60 may have a plate shape and may be electrically connected to the voltage generator 30 through the second lower interconnections 45 and the linking interconnection 41. The well plate electrode 60 may include a metal (e.g., tungsten, copper, or aluminum), a conductive metal nitride (e.g., titanium nitride or tantalum nitride), a transition metal (e.g., titanium or tantalum), or a metal silicide. In an exemplary embodiment of the inventive concept, the well plate electrode 60 may be formed of the conductive metal nitride, and a thickness of the well plate electrode 60 may be less than that of the first and second lower interconnections 43 and 45.

In an exemplary embodiment of the inventive concept, the well plate electrode 60 may overlap the second lower interconnections 45 when viewed from a plan view. Since the well plate electrode 60 has the plate shape, positions or arrangements of the well contact plugs WCP, the second lower interconnections 45, the linking interconnection 41, and the voltage generator 30 may be variously changed. This will be described later in more detail.

The semiconductor layer 70 may be in direct contact with a top surface of the well plate electrode 60. In an exemplary embodiment of the inventive concept, an area of the semiconductor layer 70 may be substantially equal to an area of the well plate electrode 60. The semiconductor layer 70 may include silicon (Si), germanium (Ge), or a mixture thereof. The semiconductor layer 70 may be formed of a semiconductor material doped with dopants having a first conductivity type or an intrinsic semiconductor material not doped with dopants. In addition, the semiconductor layer 70 may have a single-crystalline structure, an amorphous structure, or a poly-crystalline structure. In an exemplary embodiment of the inventive concept, the semiconductor layer 70 may include a cell array region CAR and a contact region CTR disposed around the cell array region CAR.

According to an exemplary embodiment of the inventive concept, a well conductive layer and a poly-silicon layer may be sequentially deposited on the lower insulation layer 50, and the poly-silicon layer and the well conductive layer may be patterned to form the well plate electrode 60 and the semiconductor layer 70. In an exemplary embodiment of the inventive concept, the poly-silicon layer may be doped with dopants having the first conductivity type during the process of depositing the poly-silicon layer. In an exemplary embodiment of the inventive concept, after an undoped poly-silicon layer is deposited, a lower portion of the semiconductor layer 70 may be doped with dopants having the first conductivity type to form a well dopant region. In an exemplary embodiment of the inventive concept, after the deposition of the poly-silicon layer, a laser annealing process may be performed to reduce a grain boundary of the poly-silicon layer.

According to an exemplary embodiment of the inventive concept, the stack structures ST may extend in parallel to each other in a first direction D1 on the semiconductor layer 70 and may be spaced apart from each other in a second direction D2. Each of the stack structures ST may include the electrodes EL and insulating layers ILD that are alternately and repeatedly stacked on the semiconductor layer 70. The electrodes EL of the stack structures ST may include a conductive material. For example, the electrodes EL may include a doped semiconductor material (e.g., doped silicon), a metal (e.g., tungsten, copper, or aluminum), a conductive metal nitride (e.g., titanium nitride or tantalum nitride), or a transition metal (e.g., titanium or tantalum). Thicknesses of the insulating layers ILD of the stack structures ST may be varied depending on characteristics of the 3D semiconductor memory device. For example, the thickness of the lowermost insulating layer ILD may be smaller than that of each of other insulating layers ILD. In addition, one or some of the insulating layers ILD may be thicker than other insulating layers ILD. The insulating layers ILD may include silicon oxide.

Each of the stack structures ST may have a stepwise structure in the contact region CTR to electrically connect the electrodes EL to the peripheral logic circuits. In other words, each of the stack structures ST may have a sloped profile in the contact region CTR.

An upper insulation layer 80 having a planarized top surface may be disposed on the semiconductor layer 70 to cover end portions of the electrodes EL which constitute the stepwise structure. In addition, a capping insulation layer 90 may cover a plurality of the stack structures ST and the upper insulation layer 80.

Bit lines BL may be disposed on the capping insulation layer 90 to cross over the stack structures ST. The bit lines BL may extend in the second direction D2. The bit lines BL may be electrically connected to the vertical structures VS through bit line contact plugs BPLG. In addition, the bit lines BL may be electrically connected to the first lower interconnections 43 of the peripheral logic structure PS.

According to an exemplary embodiment of the inventive concept, the vertical structures VS may be disposed in the cell array region CAR and may penetrate the stack structures ST to be connected to the semiconductor layer 70. In an exemplary embodiment of the inventive concept, the vertical structures VS may be arranged in a zigzag form along one direction when viewed from a plan view. In an exemplary embodiment of the inventive concept, the vertical structures VS may be arranged in a line along one direction when viewed from a plan view. In an exemplary embodiment of the inventive concept, the vertical structures VS may include a semiconductor material. Bottom surfaces of the vertical structures VS may be disposed at a level between the top surface and the bottom surface of the semiconductor layer 70. Each of the vertical structures VS may include a contact pad connected to the bit line contact plug BPLG. The contact pad may correspond to a top end portion of the vertical structure VS.

According to an exemplary embodiment of the inventive concept, a data storage layer DS may be disposed between the stack structure ST and the vertical structure VS. In an exemplary embodiment of the inventive concept, the data storage layer DS may include a charge storage layer. For example, the data storage layer DS may include a trap insulating layer, a floating gate electrode, or an insulating layer including conductive nano dots. Data stored in the data storage layer DS may be changed using Fowler-Nordheim tunneling that is caused by a voltage difference between the electrode EL and the vertical structure VS including the semiconductor material. In an exemplary embodiment of the inventive concept, the data storage layer DS may include a thin layer capable of storing data on the basis of another operation principle. For example, the data storage layer DS may include a thin layer used in a phase-change memory or a thin layer used in a variable resistance memory.

In an exemplary embodiment of the inventive concept, each of common source regions 71 may be disposed in the semiconductor layer 70 between the stack structures ST adjacent to each other. The common source regions 71 may extend in parallel to the stack structures ST along the first direction D1. In an exemplary embodiment of the inventive concept, the common source regions 71 may be formed by injecting dopants having a second conductivity type into the semiconductor layer 70. In an exemplary embodiment of the inventive concept, bottom surfaces of the common source regions 71 may be spaced apart from the top surface of the well plate electrode 60.

According to an exemplary embodiment of the inventive concept, a common source plug CSPLG may be connected to each of the common source regions 71. A sidewall insulating spacer SP may be disposed between the common source plug CSPLG and the stack structure ST. A ground voltage may be applied to the common source regions 71 through the common source plugs CSPLG during a read or program operation of the 3D semiconductor memory device. In an exemplary embodiment of the inventive concept, the common source plugs CSPLG may have substantially uniform widths and may extend in parallel to each other along the first direction D1. The sidewall insulating spacers SP may be opposite to each other between the stack structures ST adjacent to each other. In an exemplary embodiment of the inventive concept, the sidewall insulating spacer SP may fill a space between the stack structures ST adjacent to each other, and the common source plug CSPLG may penetrate the sidewall insulating spacer SP to be locally connected to the common source region 71.

An interconnecting structure that electrically connects the cell array structure CS to the peripheral logic structure PS may be disposed on end portions, having the stepwise structures, of the stack structures ST. In an exemplary embodiment of the inventive concept, the interconnecting structure may include contact plugs PLG penetrating the upper insulation layer 80 to be respectively connected to the end portions of the electrodes EL, upper interconnections UCL disposed on the capping insulation layer 90 and connected to the contact plugs PLG through contact patterns CT, one or more connection plugs WPLG penetrating the capping insulation layer 90 and the upper and lower insulation layers 80 and 50, and interconnection lines CL connecting the interconnection plugs WPLG to the upper interconnections UCL.

The contact plugs PLG disposed in the contact region CTR may have vertical lengths different from each other. Top surfaces of the contact plugs PLG may be substantially coplanar with the top surfaces of the vertical structures VS.

In an exemplary embodiment of the inventive concept, the stack structure ST and the peripheral logic structure PS may be electrically connected to each other through the interconnection plug WPLG. The interconnection plug WPLG may penetrate the capping insulating layer 90 and the upper and lower insulation layers 80 and 50 to be electrically connected to the peripheral logic circuit(s). For example, the interconnection plug WPLG may be electrically connected to the row decoder 40 (e.g., a word line driver).

During the erase operation of the 3D semiconductor memory device, the erase voltage may be provided to the semiconductor layer 70 and the vertical structures VS through the well plate electrode 60. At this time, the erase voltage may be uniformly provided to the semiconductor layer 70 through the well plate electrode 60 having the plate shape. Thus, a time for providing the erase voltage to the two-dimensionally arranged vertical structures VS may be substantially uniform. In other words, the erase voltage can be prevented from being varied according to positions of the vertical structures VS.

In an exemplary embodiment of the inventive concept, a vertical distance between the well plate electrode 60 and the voltage generator 30 may be less than a height of the cell array structure CS. Thus, a transmitting path of the erase voltage from the voltage generator 30 to the well plate electrode 60 may be reduced. In other words, a voltage drop of the erase voltage may be reduced during the erase operation of the 3D semiconductor memory device.

FIGS. 15A, 15B, 15C, and 15D are enlarged views of a portion 'A' of FIG. 12, according to an exemplary embodiment of the inventive concept.

According to an exemplary embodiment of the inventive concept, the 3D semiconductor memory device may be an NAND flash memory device. For example, the data storage layer DS disposed between the stack structure ST and the vertical structure VS may include a tunnel dielectric layer TIL, a charge storage layer CIL, and a blocking dielectric layer BLK. Data stored in the data storage layer DS may be changed using Fowler-Nordheim tunneling caused by the voltage difference between the electrode EL and the vertical structure VS including the semiconductor material.

Figure 15A:
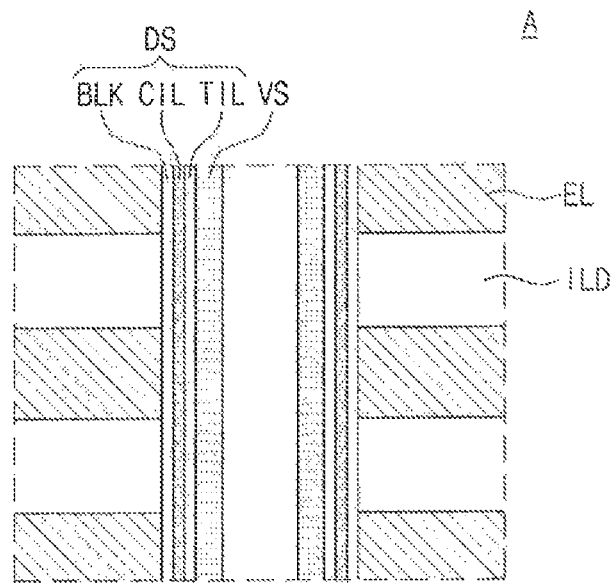
FIGS. 15A, 15B, 15C, and 15D are enlarged views of a portion 'A' of FIG. 12, according to an exemplary embodiment of the inventive concept.

According to an exemplary embodiment of the inventive concept illustrated in FIG. 15A, the tunnel dielectric layer TIL, the charge storage layer CIL, and the blocking dielectric layer BLK may extend from between the vertical structure VS and the electrode EL to between the vertical structure VS and the insulating layer ILD.

Figure 15B:
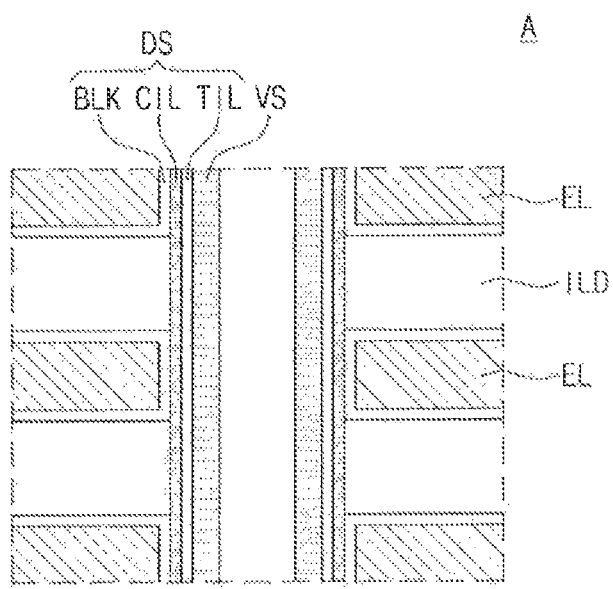

According to an exemplary embodiment of the inventive concept illustrated in FIG. 15B, the tunnel dielectric layer TIL and the charge storage layer CIL may extend from between the vertical structure VS and the electrode EL to between the vertical structure VS and the insulating layer ILD. The blocking dielectric layer BLK may extend from between the vertical structure VS and the electrode EL onto a top surface and a bottom surface of the electrode EL. In other words, the blocking dielectric layer BLK may be disposed between the electrode EL and the insulating layer ILD adjacent to each other.

Figure 15C:
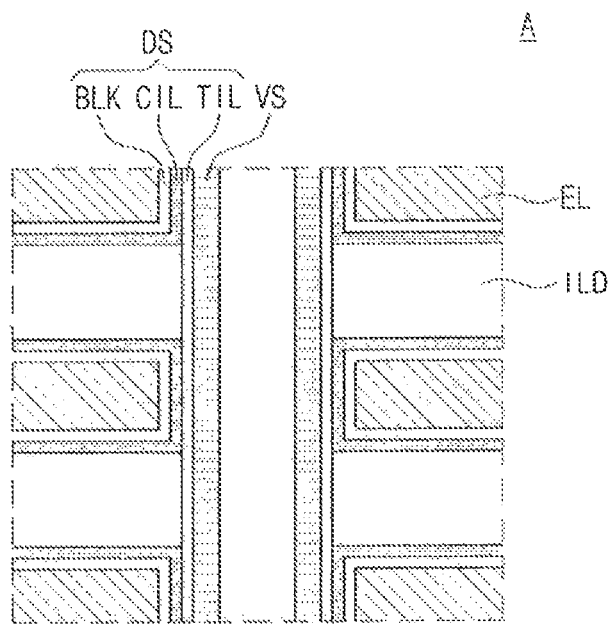

According to an exemplary embodiment of the inventive concept illustrated in FIG. 15C, the tunnel dielectric layer TIL may extend from between the vertical structure VS and the electrode EL to between the vertical structure VS and the insulating layer ILD. The charge storage layer CIL and the blocking insulating layer BLK may extend from between the vertical structure VS and the electrode EL onto the top surface and the bottom surface of the electrode EL. In other words, the charge storage layer CIL and the blocking insulating layer BLK may be disposed between the electrode EL and the insulating layer ILD adjacent to each other.

Figure 15D:
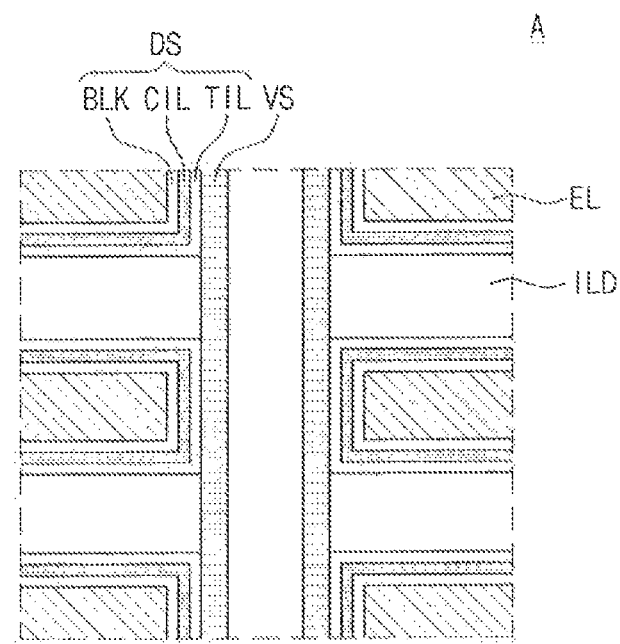

According to an exemplary embodiment of the inventive concept illustrated in FIG. 15D, the tunnel dielectric layer TIL, the charge storage layer CIL, and the blocking dielectric layer BLK may extend from between the vertical structure VS and the electrode EL onto the top surface and the bottom surface of the electrode EL. In other words, the tunnel dielectric layer TIL, the charge storage layer CIL, and the blocking dielectric layer BLK may be disposed between the electrode EL and the insulating layer ILD adjacent to each other.

The charge storage layer CIL of the data storage layer DS may include trap site-rich insulating layers or insulating layers including nano particles. The charge storage layer CIL may be formed using a chemical vapor deposition (CVD) technique or an atomic layer deposition (ALD) technique. For example, the charge storage layer CIL may include a trap insulating layer, a floating gate electrode, or an insulating layer including conductive nano dots. In an exemplary embodiment of the inventive concept, the charge storage layer CIL may include a silicon nitride layer, a silicon oxynitride layer, a silicon-rich nitride layer, a nano-crystalline silicon layer, or a laminated trap layer.

The tunnel dielectric layer TIL may include a material having an energy band gap greater than that of the charge storage layer CIL and may be formed by a CVD technique or an ALD technique. For example, the tunnel dielectric layer TIL may include a silicon oxide layer formed by the CVD technique or the ALD technique. In addition, a thermal treatment process may be performed on the tunnel dielectric layer TIL deposited by the CVD or ALD technique. The thermal treatment process may be a rapid thermal nitridation (RTN) process or an annealing process performed in an atmosphere including nitrogen or oxygen.

The blocking dielectric layer BLK may include first and second blocking dielectric layers that are formed of different materials from each other. One of the first and second blocking dielectric layers may include a material of which an energy band gap is smaller than that of the tunnel dielectric layer TIL and greater than that of the charge storage layer CIL. Each of the first and second blocking dielectric layers may be formed by a CVD technique or an ALD technique. At least one of the first and second blocking dielectric layers may be formed by a wet oxidation process.

In an exemplary embodiment of the inventive concept, the first blocking dielectric layer may include a high-k dielectric layer such as an aluminum oxide layer or a hafnium oxide layer, and the second blocking dielectric layer may include a material of which a dielectric constant is lower than that of the first blocking dielectric layer. In an exemplary embodiment of the inventive concept, the second blocking dielectric layer may include at least one of the aforementioned high-k dielectric layers, and the first blocking dielectric layer may include a material of which a dielectric constant is lower than that of the second blocking dielectric layer.

Figure 16A:
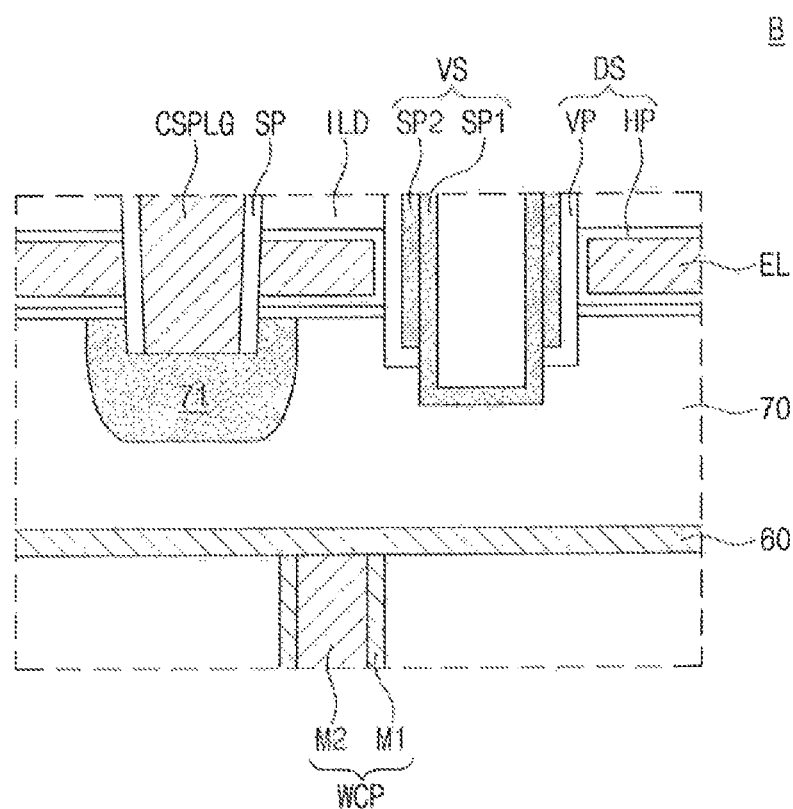
FIGS. 16A and 16B are enlarged views of a portion 'B' of FIG. 13, according to an exemplary embodiment of the inventive concept.
Figure 16B:
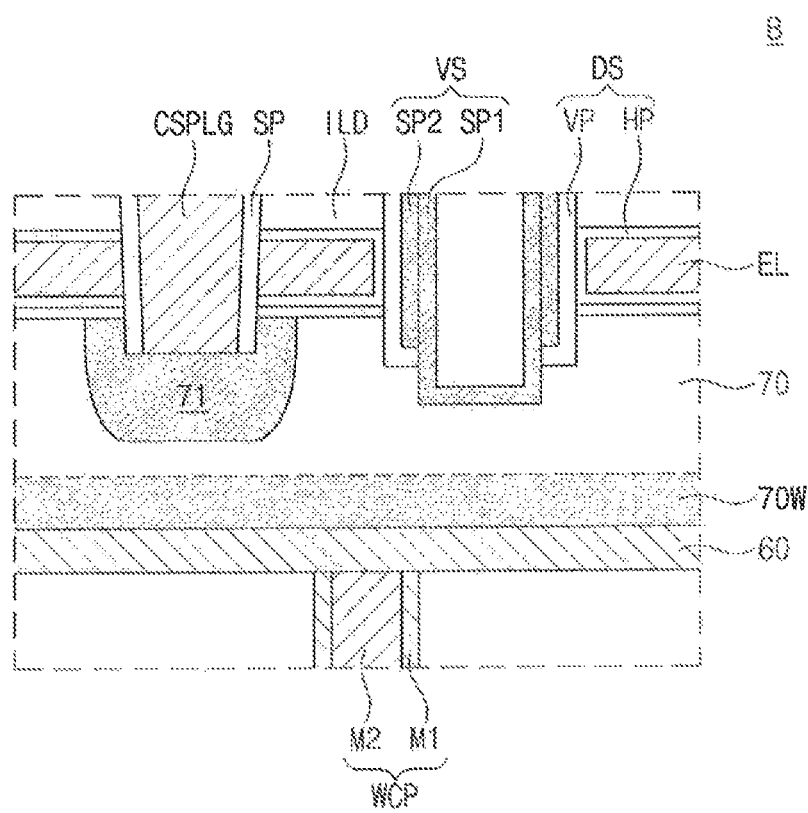

FIGS. 16A and 16B are enlarged views of a portion 'B' of FIG. 13, according to an exemplary embodiment of the inventive concept.

Referring to FIGS. 16A and 16B, the vertical structure VS may include a first semiconductor pattern SP1 connected to the semiconductor layer 70 and a second semiconductor pattern SP2 disposed between the first semiconductor pattern SP1 and the data storage layer DS. The first and second semiconductor patterns SP1 and SP2 may include a semiconductor material. In an exemplary embodiment of the inventive concept, the first semiconductor pattern SP1 may have a circular pillar shape. In an exemplary embodiment of the inventive concept, the first semiconductor pattern SP1 may have a hollow pipe shape or a hollow macaroni shape. In this case, the first semiconductor pattern SP1 may have a closed bottom end and an inside of the first semiconductor pattern SP1 may be filled with an insulating material.

The data storage layer DS may be disposed between the vertical structure VS and the stack structure ST. The data storage layer DS may include a vertical pattern VP penetrating the stack structure ST and a horizontal pattern HP extending from between the vertical pattern VP and the electrode EL onto the top surface and the bottom surface of the electrode EL.

The common source region 71 formed in the semiconductor layer 70 may include dopants having the second conductivity type and may be spaced apart from the top surface of the well plate electrode 60. According to an exemplary embodiment of the inventive concept illustrated in FIG. 16B, the semiconductor layer 70 may include a well dopant region 70w that has the first conductivity type and is in contact with the well plate electrode 60. The well dopant region 70w may be heavily doped to reduce an ohmic resistance between the well plate electrode 60 and the semiconductor layer 70. The common source region 71 having the second conductivity type may be spaced apart from the well dopant region 70w.

The well plate electrode 60 may be thinner than the semiconductor layer 70 and may be connected to the well contact plug WCP. In an exemplary embodiment of the inventive concept, the well contact plug WCP may include a barrier metal layer M1 and a metal layer M2. The well plate electrode 60 may be formed of the same material as the barrier metal layer M1. For example, the barrier metal layer M1 may include tantalum (Ta), tantalum nitride (TaN), tantalum-silicon nitride (TaSiN), titanium (Ti), titanium nitride (TiN), titanium-silicon nitride (TiSiN), tungsten (W), or tungsten nitride (WN). The metal layer M2 may include tungsten (W), aluminum (Al), copper (Cu), or a copper alloy. In other words, in an exemplary embodiment of the inventive concept, the well plate electrode 60 may be formed of the same material as the barrier metal layer M1 of which an electrical conductivity is lower than that of the metal layer M2. Thus, a contact resistance between the well plate electrode 60 and the semiconductor layer 70 may be reduced as well as a reactivity between the well plate electrode 60 and the semiconductor layer 70.

Figure 17A:
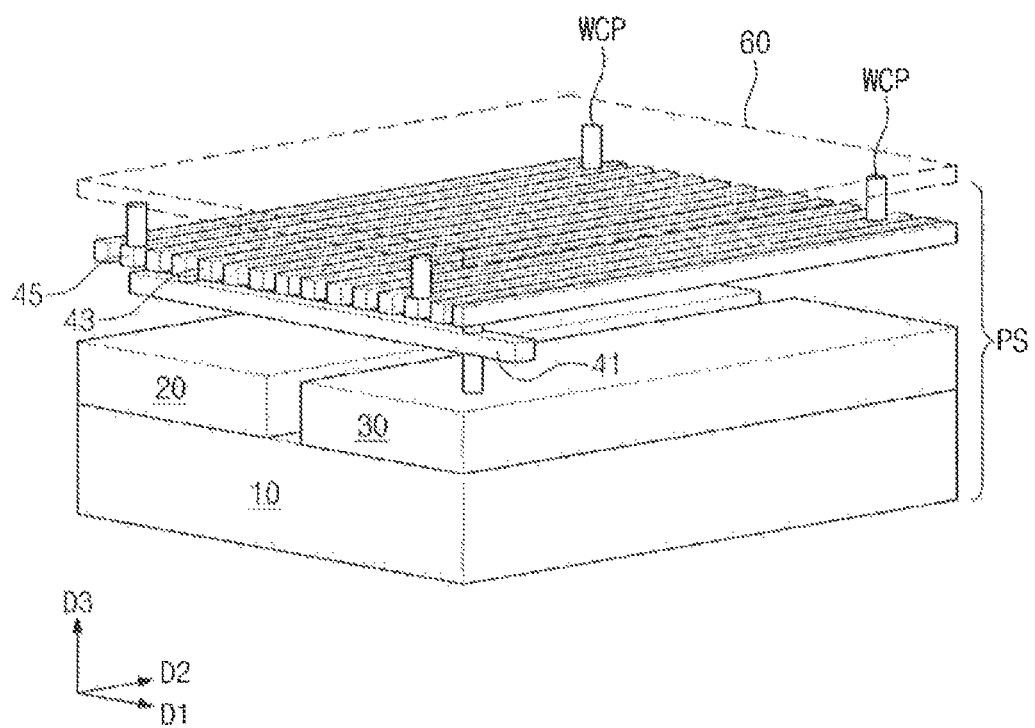
FIGS. 17A, 17B, and 17C are perspective views each illustrating peripheral logic structures of 3D semiconductor memory device according to an exemplary embodiment of the inventive concept.
Figure 17B:
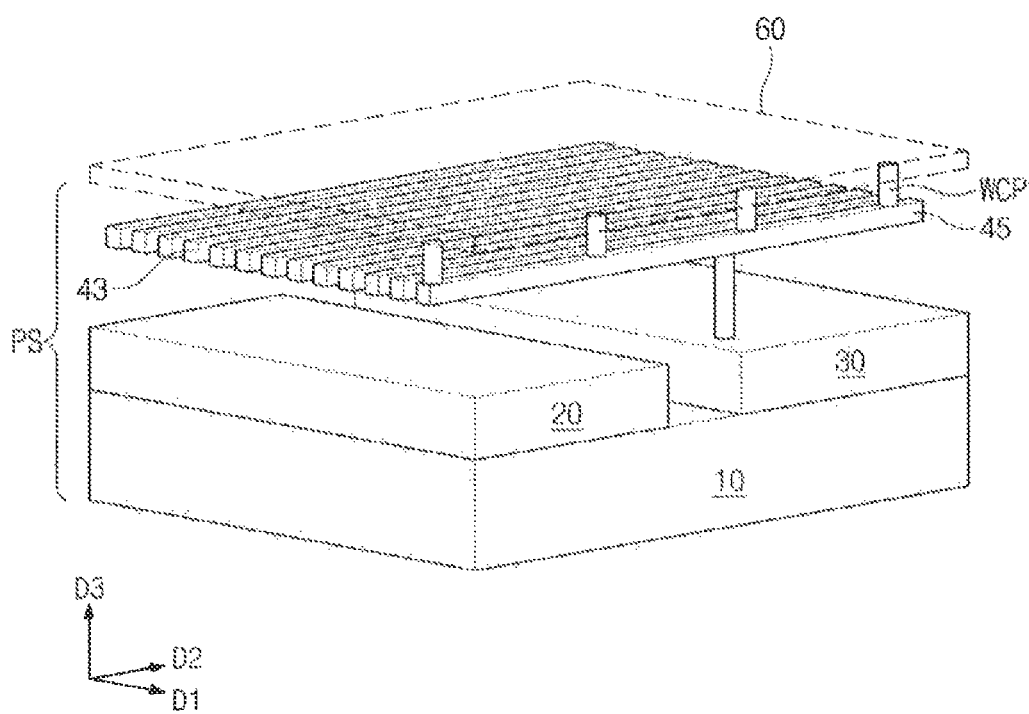
Figure 17C:
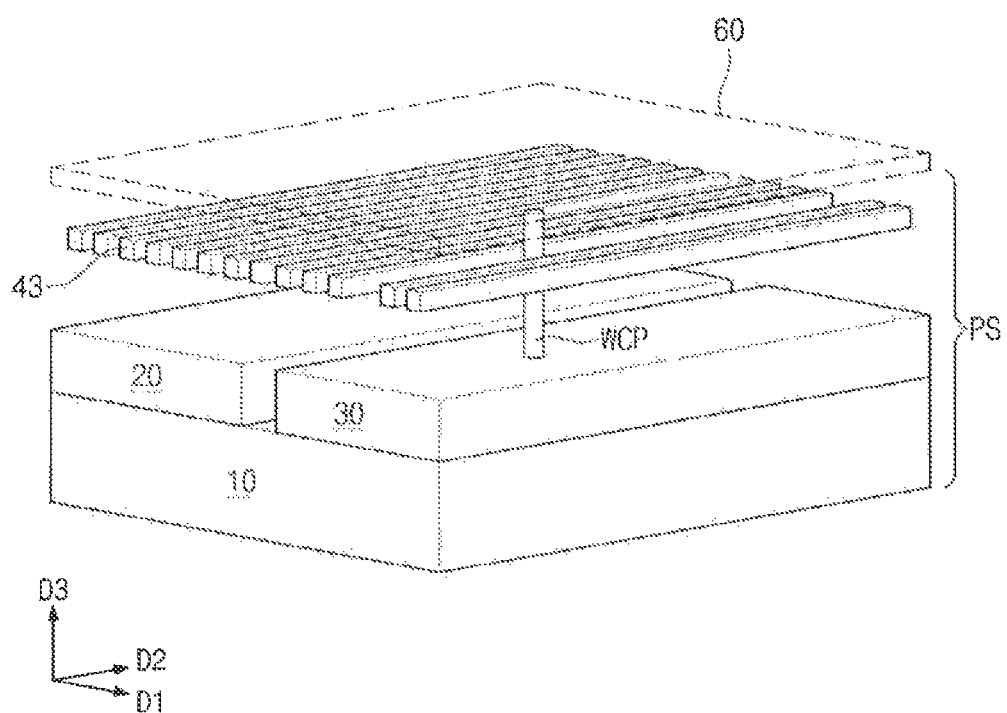

FIGS. 17A, 17B, and 17C are perspective views each illustrating peripheral logic structures of 3D semiconductor memory devices according to an exemplary embodiment of the inventive concept.

A peripheral logic structure PS may include peripheral logic circuits integrated on a semiconductor substrate 10, a lower interconnection structure electrically connected to the peripheral logic circuits, and a lower insulation layer 50 covering the peripheral logic circuits and the lower interconnection structure.

According to an exemplary embodiment of the inventive concept illustrated in FIG. 17A, the lower interconnection structure may include first lower interconnections 43 electrically connected to the page buffer 20, a linking interconnection 41 electrically connected to the voltage generator 30, and second lower interconnections 45.

The first lower interconnections 43 and the second lower interconnections 45 may extend in parallel to each other along one direction and may be disposed at the same level from a top surface of the semiconductor substrate 10. Positions of the second lower interconnections 45 may be freely changed under the well plate electrode 60.

In an exemplary embodiment of the inventive concept, the first lower interconnections 43 may be arranged between the second lower interconnections 45 spaced apart from each other. The second lower interconnections 45 spaced apart from each other may be connected in common to the linking interconnection 41 through contact plugs, and the linking interconnection 41 may be electrically connected to the voltage generator 30 through a contact plug. The well contact plugs WCP may be connected to top surfaces of the second lower interconnections 45 and may also be connected to the well plate electrode 60 having the plate shape.

The number of the second lower interconnections 45 is two in FIG. 17A. However, the inventive concept is not limited thereto. In an exemplary embodiment of the inventive concept, the number of the second lower interconnections 45 may be greater than two, and the linking interconnection 41 may be provided in plural.

According to an exemplary embodiment of the inventive concept illustrated in FIG. 17B, a lower interconnection structure may include first lower interconnections 43 electrically connected to the page buffer 20 and a second lower interconnection 45 electrically connected to the voltage generator 30. The first lower interconnections 43 and the second lower interconnection 45 may extend in parallel to each other along one direction and may be disposed at the same level from the top surface of the semiconductor substrate 10. In the present embodiment, the second lower interconnection 45 may be directly connected to the voltage generator 30 through a contact plug. In other words, the linking interconnection 41 of FIG. 17A may be omitted in the present embodiment. A position of the second lower interconnection 45 may be freely changed under the well plate electrode 60. The well contact plugs WCP may be connected to the top surface of the second lower interconnection 45 and may also be connected to the well plate electrode 60 having the plate shape. In the present embodiment, the well plate electrode 60 may be electrically connected to the voltage generator 30 through one second lower interconnection 45.

According to an exemplary embodiment of the inventive concept illustrated in FIG. 17C, the well plate electrode 60 may be directly connected to the voltage generator 30 through the well contact plug WCP. In other words, the linking interconnection 41 and the second lower interconnection 45 of FIG. 17A may be omitted in the present embodiment. Since the well plate electrode 60 has the plate shape in the present embodiment, positions of the well contact plug WCP and voltage generator 30 may be freely changed under the well plate electrode 60.

Figure 18A:
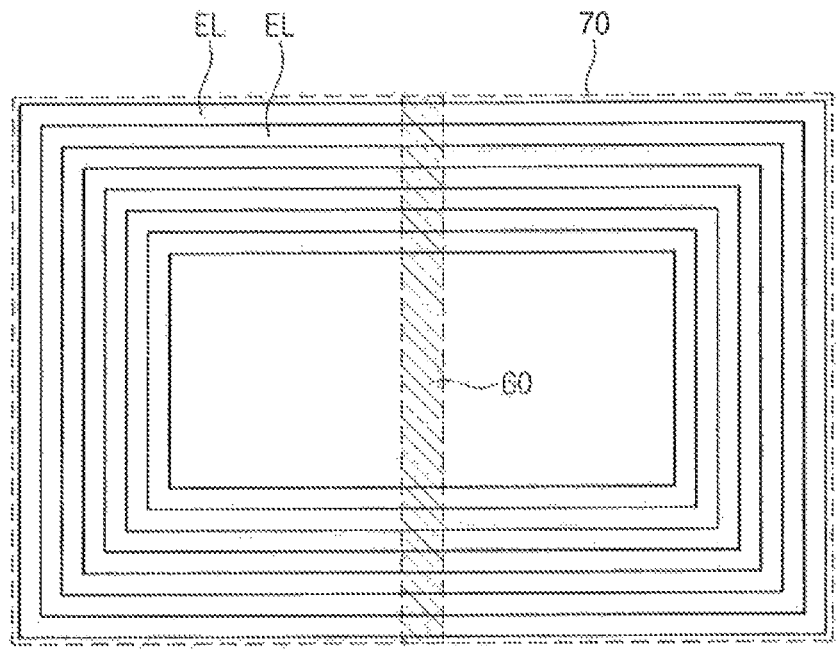
FIGS. 18A and 18B each illustrate a well plate electrode included in a 3D semiconductor memory device according to an exemplary embodiment of the inventive concept.
Figure 18B:
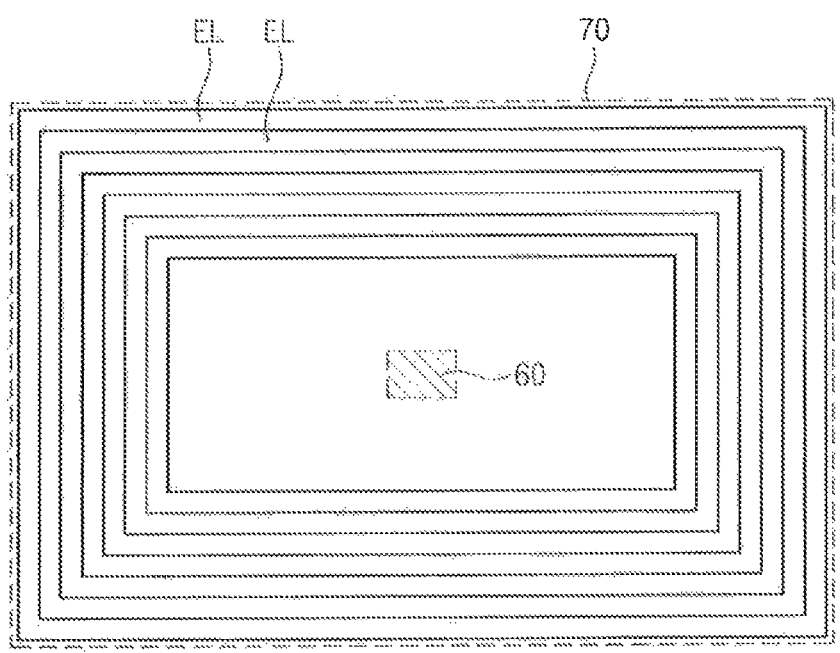

FIGS. 18A and 18B each illustrate a well plate electrode included in a 3D semiconductor memory device according to an exemplary embodiment of the inventive concept.

Referring to FIGS. 18A and 18B, a well plate electrode 60 may be disposed on the bottom surface of the semiconductor layer 70, and electrodes EL may be vertically stacked on the top surface of the semiconductor layer 70. An area of the lowermost electrode EL may be substantially equal to an area of the semiconductor layer 70. Areas of the electrodes EL may decrease as a distance from the top surface of the semiconductor layer 70 increases.

In the embodiments illustrated in FIGS. 18A and 18B, the well plate electrode 60 may be in contact with a portion of the semiconductor layer 70. For example, as illustrated in FIG. 18A, the well plate electrode 60 may have a line shape that intersects a central portion of the semiconductor layer 70. Additionally, the well plate electrode 60 may have an island shape that overlaps a central portion of the semiconductor layer 70, as illustrated in FIG. 18B.

Figure 19:
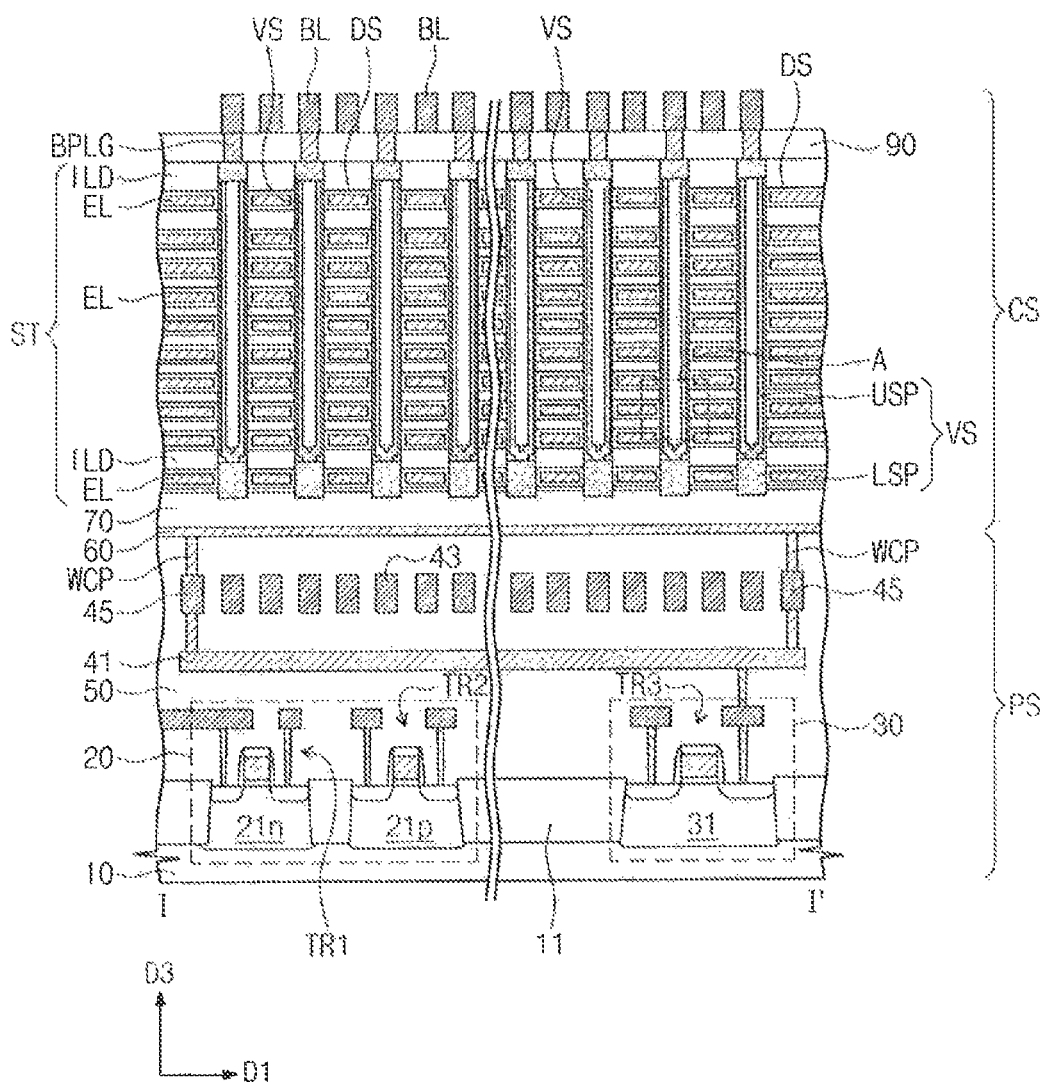
FIGS. 19 and 20 are cross-sectional views respectively taken along lines I-I' and II-II' of FIG. 11 to illustrate a 3D semiconductor memory device according to an exemplary embodiment of the inventive concept.
Figure 20:
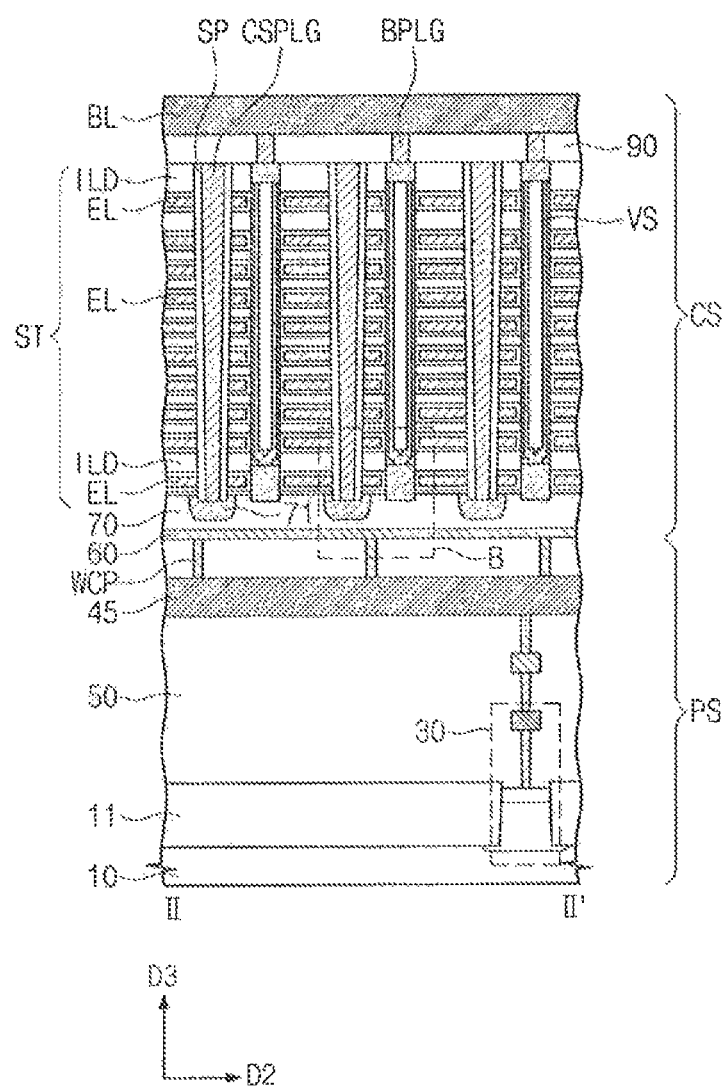
Figure 21:
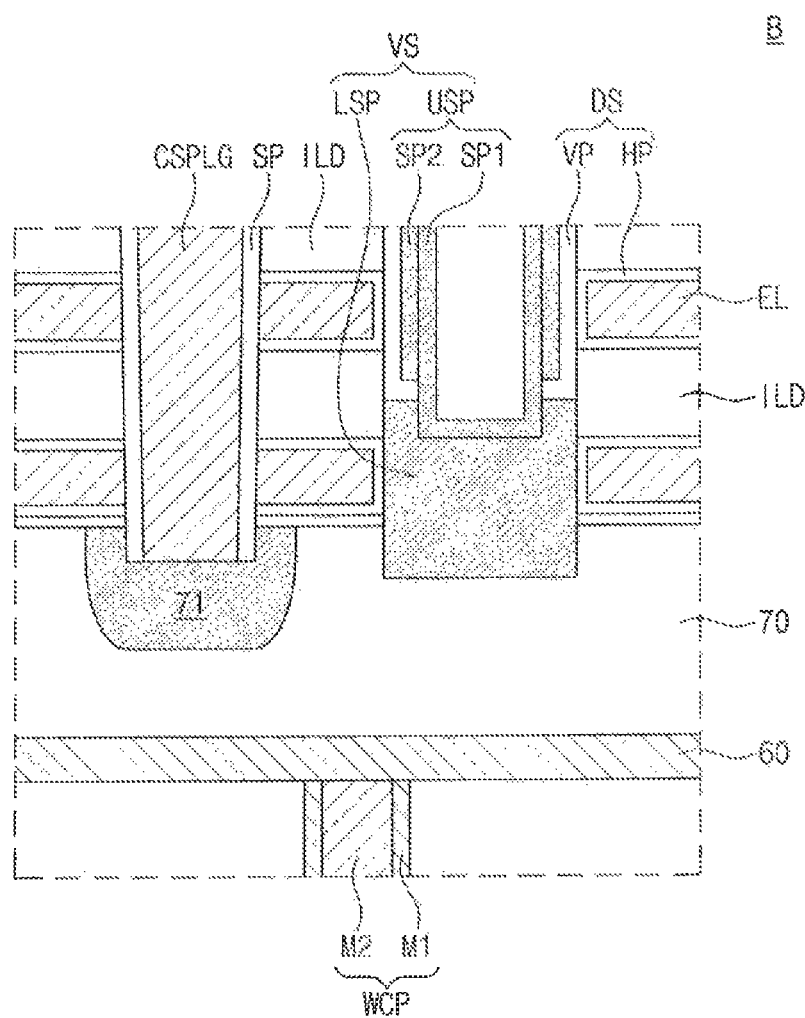
FIG. 21 is an enlarged view of a portion 'B' of FIG. 20, according to an exemplary embodiment of the inventive concept.

FIGS. 19 and 20 are cross-sectional views respectively taken along lines I-I' and II-II' of FIG. 11 to illustrate a 3D semiconductor memory device according to an exemplary embodiment of the inventive concept. FIG. 21 is an enlarged view of a portion 'B' of FIG. 20, according to an exemplary embodiment of the inventive concept.

Referring to FIGS. 19 and 20, a cell array structure CS may be stacked on a peripheral logic structure PS. In other words, the cell array structure CS may overlap the peripheral logic structure PS when viewed from a plan view.

As described above, the peripheral logic structure PS may include the peripheral logic circuits such as the row and column decoders (2 and 4 of FIG. 1), the page buffer (3 of FIG. 1), and the control circuits (5 of FIG. 1). The peripheral logic circuits may be integrated on an entire top surface of a semiconductor substrate 10. In addition, the peripheral logic structure PS may further include a lower interconnection structure electrically connected to the peripheral logic circuits and a lower insulation layer 50 covering the peripheral logic circuits and the lower interconnection structure.

According to an exemplary embodiment of the inventive concept, the lower interconnection structure may be disposed between the cell array structure CS and the peripheral logic circuits in a vertical view. The lower interconnection structure may include first lower interconnections 43, a linking interconnection 41, and second lower interconnections 45. The first lower interconnections 43 may be electrically connected to the page buffer 20. The linking interconnection 41 and the second lower interconnections 45 may be electrically connected to the voltage generator 30. In addition, one or more well contact plugs WCP may be connected to the second lower interconnections 45. Top surfaces of the well contact plugs WCP may be substantially coplanar with the top surface of the lower insulation layer 50.

According to an exemplary embodiment of the inventive concept, the cell array structure CS may include a well plate electrode 60, a semiconductor layer 70 covering the well plate electrode 60, stack structures ST disposed on the semiconductor layer 70, and vertical structures VS penetrating each of the stack structures ST. Each of the stack structures ST may include electrodes EL vertically stacked on the semiconductor layer 70.

As described above, the well plate electrode 60 may be disposed on the top surface of the lower insulation layer 50 and may be in contact with the top surfaces of the well contact plugs WCP. In an exemplary embodiment of the inventive concept, the well plate electrode 60 may have a plate shape. The well plate electrode 60 may be electrically connected to the voltage generator 30 through the second lower interconnections 45 and the linking interconnection 41.

The semiconductor layer 70 may be in direct contact with the top surface of the well plate electrode 60. In an exemplary embodiment of the inventive concept, an area of the semiconductor layer 70 may be substantially equal to an area of the well plate electrode 60.

The stack structures ST may extend in parallel to each other in a first direction D1 on the semiconductor layer 70 and may be spaced apart from each other in a second direction D2. Each of the stack structures ST may include the electrodes EL and insulating layers ILD which are alternately and repeatedly stacked on the semiconductor layer 70.

According to the present embodiment, each of the vertical structures VS may include a lower semiconductor pattern LSP penetrating a lower portion of the stack structure ST and an upper semiconductor pattern USP penetrating an upper portion of the stack structure ST. The lower semiconductor pattern LSP may be connected to the semiconductor layer 70, and the upper semiconductor pattern USP may be connected to the lower semiconductor pattern LSP. In the present embodiment, the vertical pattern VP of the data storage layer DS may be disposed between the upper semiconductor pattern USP and the stack structure ST, as illustrated in FIG. 21.

According to an exemplary embodiment of the inventive concept, the upper semiconductor pattern USP may have a hollow pipe shape or a hollow macaroni shape. Here, a bottom end of the upper semiconductor pattern USP may be closed, and an inside of the upper semiconductor pattern USP may be filled with an insulating pattern. In addition, a bottom surface of the upper semiconductor pattern USP may be lower than a topmost portion of a top surface of the lower semiconductor pattern LSP. In other words, a portion of the top surface of the lower semiconductor pattern LSP may be recessed, and a bottom end portion of the upper semiconductor pattern USP may be inserted into the recessed region of the top surface of the lower semiconductor pattern LSP. The upper semiconductor pattern USP may be formed of a semiconductor material. For example, the upper semiconductor pattern USP may include silicon (Si), germanium (Ge), or a mixture thereof. The upper semiconductor pattern USP may be formed of a semiconductor material doped with dopants or an intrinsic semiconductor material not doped with dopants. The upper semiconductor pattern USP may have a single-crystalline structure, an amorphous structure, or a poly-crystalline structure. In addition, the upper semiconductor pattern USP may have a conductive pad corresponding to its top end portion. The conductive pad may be a dopant region doped with dopants or may be formed of a conductive material.

In more detail, the upper semiconductor pattern USP may include a first semiconductor pattern SP1 and a second semiconductor pattern SP2, as illustrated in FIG. 21. The first semiconductor pattern SP1 may be connected to the lower semiconductor pattern LSP and may have a pipe or macaroni shape having a closed bottom end. The inside of the first semiconductor pattern SP1 may be filled with an insulating pattern. The first semiconductor pattern SP1 may be in contact with an inner sidewall of the second semiconductor pattern SP2 and the top surface of the lower semiconductor pattern LSP. In other words, the first semiconductor pattern SP1 may electrically connect the second semiconductor pattern SP2 to the lower semiconductor pattern LSP. The second semiconductor pattern SP2 may cover an inner sidewall of the stack structure ST. The second semiconductor pattern SP2 may have a pipe or macaroni shape of which top and bottom ends are opened. The second semiconductor pattern SP2 may not be in contact with the lower semiconductor pattern LSP but may be spaced apart from the lower semiconductor pattern LSP. The first and second semiconductor patterns SP1 and SP2 may be undoped or may be doped with dopants having the same conductivity type as the semiconductor layer 70. The first and second semiconductor patterns SP1 and SP2 may be in a poly-crystalline state or a single-crystalline state.

According to an exemplary embodiment of the inventive concept, the lower semiconductor pattern LSP may be used as a channel region of the ground selection transistor GST described with reference to FIG. 3. The lower semiconductor pattern LSP may be formed of a semiconductor material having the same conductivity type as the semiconductor layer 70. In an exemplary embodiment of the inventive concept, the lower semiconductor pattern LSP may be an epitaxial pattern that is formed by an epitaxial technique or a laser crystallization technique which uses the semiconductor layer 70 as a seed. In this case, the lower semiconductor pattern LSP may have a single-crystalline structure or may have a poly-crystalline structure of which a grain size is greater than that of a semiconductor material formed by a CVD technique. In an exemplary embodiment of the inventive concept, the lower semiconductor pattern LSP may be formed of a poly-crystalline semiconductor material (e.g., poly-crystalline silicon). According to an exemplary embodiment of the inventive concept, the insulating layer ILD adjacent to the lower semiconductor pattern LSP may be in direct contact with a sidewall of the lower semiconductor pattern LSP.

In an exemplary embodiment of the inventive concept, the lower semiconductor pattern LSP may have a pillar shape penetrating the lowermost electrode EL, as illustrated in FIG. 21. A bottom surface of the lower semiconductor pattern LSP may be lower than the top surface of the semiconductor layer 70 and may be spaced apart from the well plate electrode 60. The top surface of the lower semiconductor pattern LSP may be higher than a top surface of the lowermost electrode EL.

Figure 22:
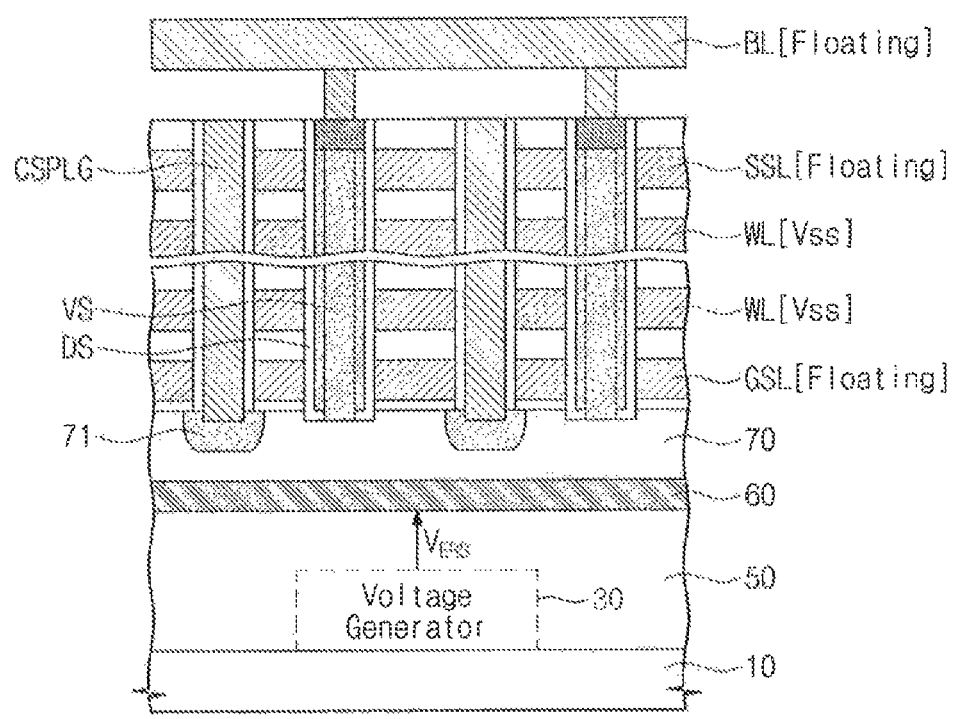
FIG. 22 is a view illustrating an erasing operation of a 3D semiconductor memory device according to an exemplary embodiment of the inventive concept.

FIG. 22 is a view illustrating an erasing operation of a 3D semiconductor memory device according to an exemplary embodiment of the inventive concept. The 3D semiconductor memory device according to the present embodiment may be a NAND flash memory device like that described with reference to FIG. 3.

Referring to FIG. 22, during the erase operation of the NAND flash memory device, a voltage difference may be provided between the vertical structure VS including the semiconductor material and the word line to discharge charges stored in the data storage layer DS to the vertical structure VS.

An erase voltage $V_{ERS}$ generated from the voltage generator 30 may be applied to the well plate electrode 60 during the erase operation. For example, the erase voltage $V_{ERS}$ may be in a range of 10V to 20V. A ground voltage Vss may be applied to the word lines WL. The ground selection line GSL, the string selection line SSL, the bit line BL, and the common source plug CSPLG may be floated during the erase operation.

Under the voltage conditions described above, the erase voltage $V_{ERS}$ applied to the well plate electrode 60 may be transmitted to the semiconductor layer 70 and the vertical structure VS including the semiconductor material. Thus, a large voltage difference may be provided between the vertical structure VS and the word lines WL to discharge the charges stored in the data storage layer DS to the vertical structure VS by Fowler-Nordheim tunneling. According to an exemplary embodiment of the inventive concept, since the erase voltage $V_{ERS}$ may be applied to the entire bottom surface of the semiconductor layer 70 through the well plate electrode 60, a difference between the erase voltage $V_{ERS}$ transmitted to the vertical structure VS disposed in a central region of the cell array structure CS and the erase voltage $V_{ERS}$ transmitted to the vertical structure VS disposed in an edge region of the cell array structure CS can be reduced or minimized.

Figure 23:
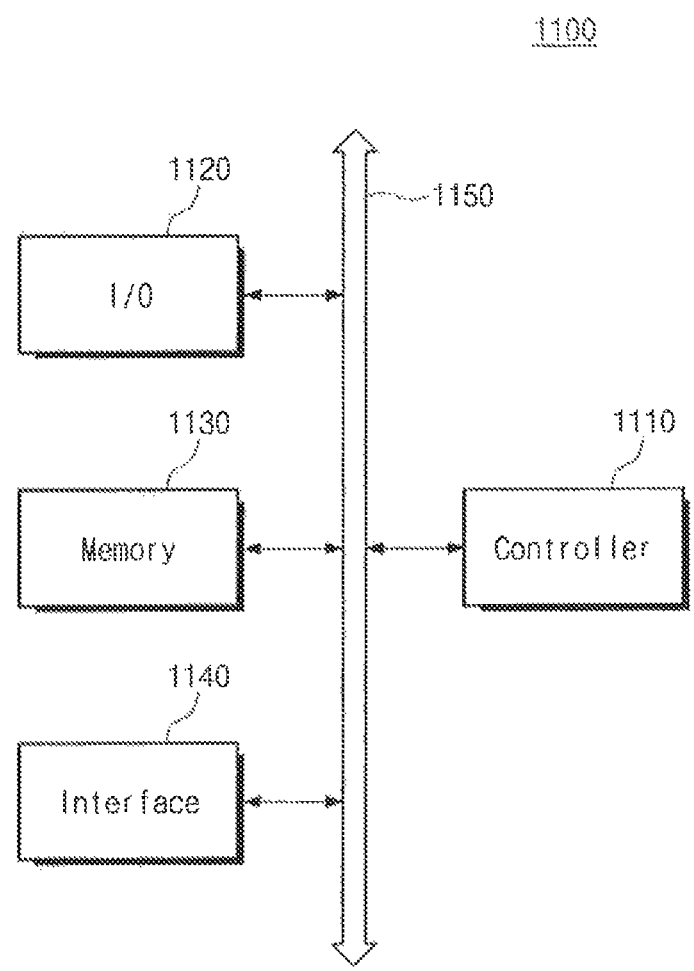
FIG. 23 is a block diagram illustrating an electronic system including a 3D semiconductor memory device according to an exemplary embodiments of the inventive concept.

FIG. 23 is a block diagram illustrating an electronic system including a 3D semiconductor memory device according to an exemplary embodiment of the inventive concept.

Referring to FIG. 23, an electronic system 1100 may be applied to a personal digital assistant (PDA), a portable computer, a web tablet, a wireless phone, a mobile phone, a digital music player, a memory card, or other electronic products for receiving and/or transmitting information data wirelessly.

The electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices having a similar function to any one thereof. The memory device 1130 may store data and/or commands executed by the controller 1110. The I/O unit 1120 may receive data or signals from the outside or may output data or signals to the outside. For example, the I/O unit 1120 may include a keypad, a keyboard and/or a display device.

The memory device 1130 may include a 3D semiconductor memory device according to an exemplary embodiment of the inventive concept. In addition, the memory device 1130 may further include another type of memory device or a random access non-volatile memory device.

The interface unit 1140 may transmit electrical data to a communication network and/or may receive electrical data from a communication network.

Figure 24:
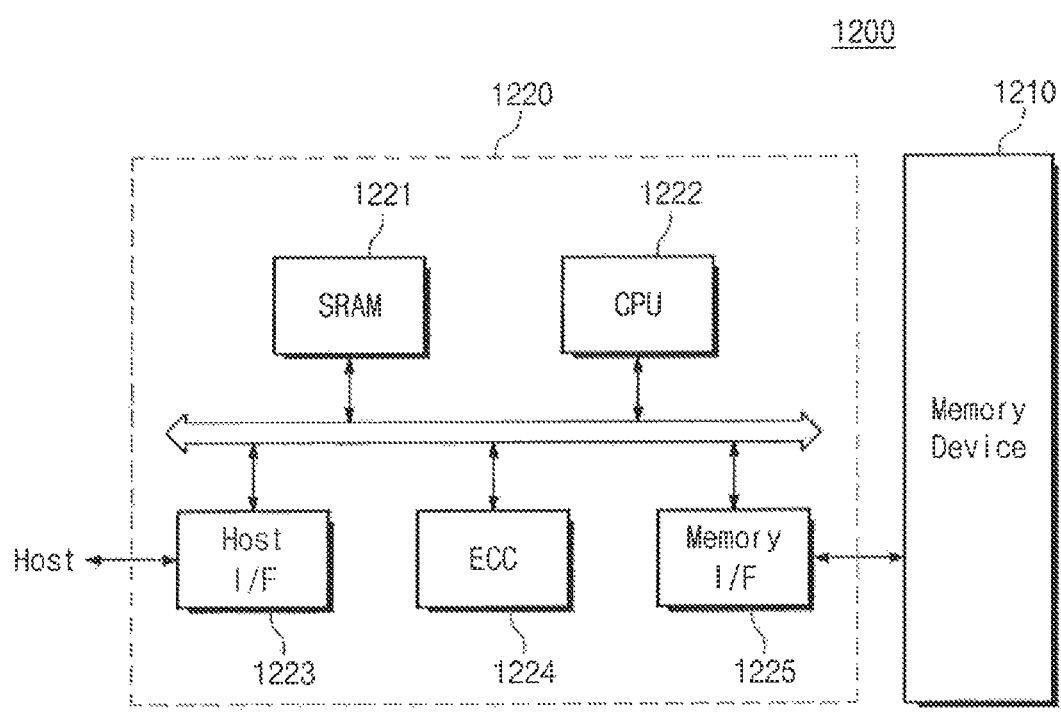
FIG. 24 is a block diagram illustrating a memory card including a 3D semiconductor memory device according to an exemplary embodiment of the inventive concept.

FIG. 24 is a block diagram illustrating a memory card including a 3D semiconductor memory device according to an exemplary embodiment of the inventive concept.

Referring to FIG. 24, a memory card 1200 used for storing data may include a memory device 1210 implemented with a 3D semiconductor memory device according to an exemplary embodiment of the inventive concept. The memory card 1200 may include a memory controller 1220 that controls data communication between a host and the memory device 1210.

A static random access memory (SRAM) device 1221 may be used as a working memory of a central processing unit (CPU) 1222. A host interface unit 1223 may be configured to include a data communication protocol between the memory card 1200 and the host. An error check and correction (ECC) block 1224 may detect and correct errors of data which are read out from the memory device 1210. A memory interface unit 1225 may interface with the memory device 1210. The CPU 1222 may control overall operations for data communication of the memory controller 1220. The memory card 1200 may further include a read only memory (ROM) device that stores code data used for interfacing with the host.

Figure 25:
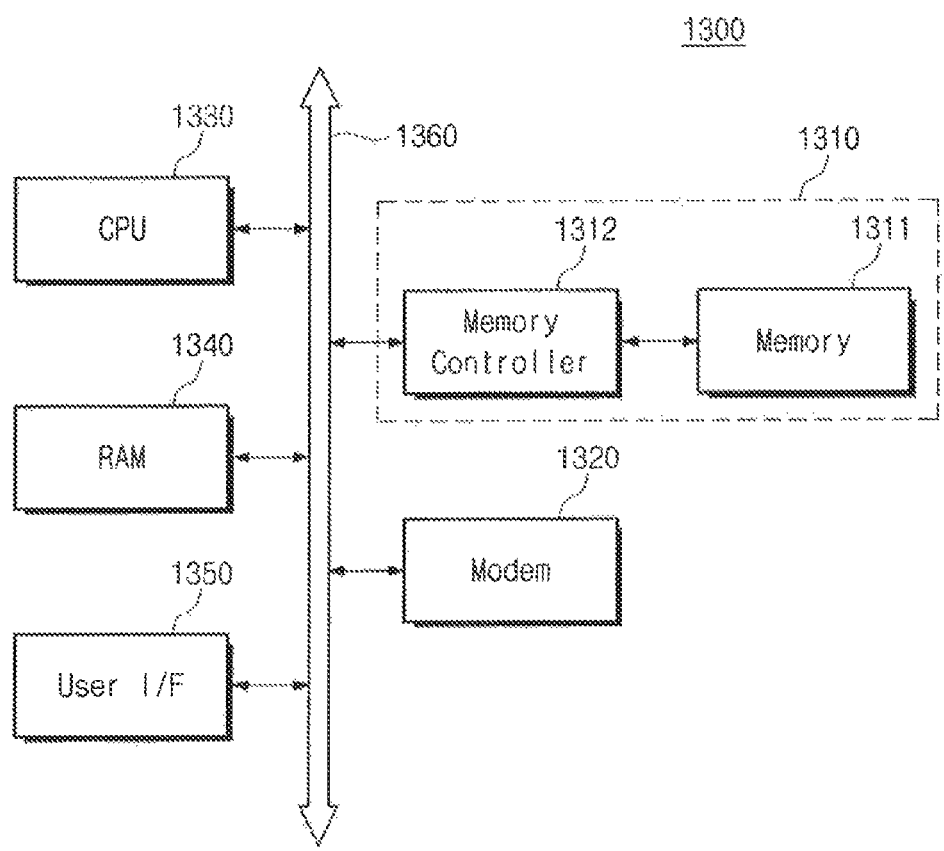
FIG. 25 is a block diagram illustrating an information processing system including a 3D semiconductor memory device according to an exemplary embodiment of the inventive concept.

FIG. 25 is a block diagram illustrating an information processing system including a 3D semiconductor memory device according to an exemplary embodiment of the inventive concept.

Referring to FIG. 25, a memory system 1310 may be installed in an information processing system 1300 such as a mobile device or a desktop computer. The information processing system 1300 may include a modem 1320, a CPU 1330, a RAM 1340, and a user interface unit 1350 that are electrically connected to the memory system 1310 through a system bus 1360. The memory system 1310 may have the substantially same structure as the memory card 1200 described with reference to FIG. 24. In other words, the memory system 1310 may include a memory device 1311 and a memory controller 1312. The memory system 1310 may store data processed by the CPU 1330 or data inputted from an external system. In an exemplary embodiment of the inventive concept, the memory system 1310 may be a solid state disk (SSD). In this case, the information processing system 1300 may stably store data in the memory system 1310. In addition, as reliability of the memory system 1310 increases, the memory system 1310 may reduce a resource consumed for correcting errors. Thus, the information processing system 1300 may perform a fast data exchange function. The information processing system 1300 may further include an application chipset, a camera image processor (CIS), and/or an input/output (I/O) unit.

The 3D semiconductor memory devices and/or the memory system described above may be encapsulated using various packaging techniques. For example, the 3D semiconductor memory devices and/or the memory system according to the aforementioned exemplary embodiments of the inventive concept may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to an exemplary embodiment of the inventive concept, a cell array structure may be formed on a peripheral logic structure. The cell array structure may include may include a semiconductor layer formed on a top surface of a well plate electrode and memory cells three-dimensionally arranged on the semiconductor layer. During the erase operation of the memory cells, an erase voltage may be applied to the semiconductor layer and the memory cells through the well plate electrode covering a bottom surface of the semiconductor layer. In other words, the erase voltage may be applied to the entire bottom surface of the semiconductor layer, such that the voltage drop may be reduced when the erase voltage is transmitted to the three-dimensionally arranged memory cells.

While the inventive concept has been described with reference to exemplary embodiments thereof, it will be apparent to those skilled in the art that various changes and modifications may be made thereto without departing from the scope of the inventive concept as defined by the following claims and their equivalents.

What is claimed is:

1. A three-dimensional (3D) semiconductor memory device, comprising:
a metal silicide layer;
a silicon layer on a top surface of the metal silicide layer;
a stack structure comprising a plurality of electrodes vertically stacked on the silicon layer, and
a plurality of vertical structures penetrating the stack structure and connected to the silicon layer.

2. The 3D semiconductor memory device of claim 1, further comprising a peripheral logic structure comprising peripheral logic circuits disposed on a semiconductor substrate and a first insulation layer covering the peripheral logic circuits,
wherein the metal silicide layer is disposed on the first insulation layer.

3. The 3D semiconductor memory device of claim 2, wherein the metal silicide layer is in direct contact with the first insulation layer.

4. The 3D semiconductor memory device of claim 2, Wherein the peripheral logic structure further comprises at least two interconnections located at different levels from a top surface of the semiconductor substrate.

5. The 3D semiconductor memory device of claim 2, wherein the peripheral logic circuits include a plurality of MOS transistors on the semiconductor substrate, and wherein the MOS transistors are overlapped with the metal silicide layer.

6. The 3D semiconductor memory device of claim 2, wherein the peripheral logic circuits include a voltage generator disposed on the semiconductor substrate and electrically connected to the metal silicide layer.

7. The 3D semiconductor memory device of claim 1, wherein the stack structure extends in a first direction on the silicon layer,
wherein the silicon layer includes a common source region disposed at a side of the stack structure, and
wherein the common source region has dopants of a first conductivity type.

8. The 3D semiconductor memory device of claim 1, wherein the silicon layer has dopants of a second conductivity type,
wherein the silicon layer comprises:
a first portion in contact with the metal silicide layer; and
a second portion on the first portion, and.
wherein a concentration of the dopants of the second conductivity type in the first portion is higher than a concentration of the dopants of the second conductivity type in the second portion.

9. The 3D semiconductor memory device of claim 1, wherein the silicon layer includes a well dopant region having a second conductivity type, and
wherein the well dopant region is in contact with the metal silicide layer.

10. The 3D semiconductor memory device of claim 1, wherein each of the vertical structures comprises:

a vertical semiconductor layer connected to the silicon layer; and a data storage layer disposed between the stack structure and the vertical semiconductor layer.

11. The 3D semiconductor memory device of claim 1, further comprising a connection plug electrically connecting one of the electrodes with the peripheral logic structure.

12. The 3D semiconductor memory device of claim 1, wherein the stack structure has a stepwise structure defined by end portions of the electrodes.

13. A three-dimensional (3D) semiconductor memory device, comprising:
 a peripheral logic structure comprising peripheral logic circuits disposed on a semiconductor substrate and a first insulation layer covering the peripheral logic circuits;
 a metal silicide layer disposed on the peripheral logic structure;
 a silicon layer on a top surface of the metal silicide layer;
 a stack structure comprising a plurality of electrodes vertically stacked on the silicon layer, and
 a plurality of vertical structures penetrating the stack structure and connected to the silicon layer.

14. The 3D semiconductor memory device of claim 13, wherein the metal silicide layer and the silicon layer are overlapped with the peripheral logic structure.

15. The 3D semiconductor memory device of claim 13, wherein the metal silicide layer is in direct contact with the first insulation layer.

16. The 3D semiconductor memory device of claim 13, wherein the peripheral logic structure further comprises at least two interconnections located at different levels from a top surface of the semiconductor substrate, and
 wherein the interconnections are electrically connected to the peripheral logic circuits.

17. The 3D semiconductor memory device of claim 13, wherein the peripheral logic structure further comprises an interconnection structure for electrically connecting the metal silicide layer to the peripheral logic circuits.

18. The 3D semiconductor memory device of claim 13, wherein the silicon layer has dopants of a second conductivity type,
 wherein the silicon layer comprises: a first portion in contact with the metal silicide layer; and a second portion on the first portion, and
 wherein a concentration of the dopants of the second conductivity type in the first portion is higher than a concentration of the dopants of the second conductivity type in the second portion.

19. The 3D semiconductor memory device of claim 13, wherein the stack structure has a stepwise structure defined by end portions of the electrodes.

20. The 3D semiconductor memory device of claim 13, further comprising a connection plug electrically connecting one of the electrodes with the peripheral logic structure.

\* \* \* \* \*